US012588185B2

(12) United States Patent
Jang et al.

(10) Patent No.: US 12,588,185 B2
(45) Date of Patent: Mar. 24, 2026

(54) METHOD OF FABRICATING SEMICONDUCTOR MEMORY DEVICE INCLUDING CAPPING LAYER

(71) Applicant: Samsung Electronics Co., Ltd., Suwon-si (KR)

(72) Inventors: Hyeon-Woo Jang, Hwaseong-si (KR); Dong-Wan Kim, Hwaseong-si (KR); Keonhee Park, Suwon-si (KR); Dong-Sik Park, Suwon-si (KR); Joonsuk Park, Suwon-si (KR); Jihoon Chang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 737 days.

(21) Appl. No.: 17/723,747

(22) Filed: Apr. 19, 2022

(65) Prior Publication Data

US 2023/0039205 A1      Feb. 9, 2023

(30) Foreign Application Priority Data

Aug. 3, 2021      (KR) ........................ 10-2021-0101971

(51) Int. Cl.
H10B 12/00          (2023.01)
(52) U.S. Cl.
CPC ........... *H10B 12/09* (2023.02); *H10B 12/315* (2023.02); *H10B 12/34* (2023.02); *H10B 12/482* (2023.02); *H10B 12/50* (2023.02)

(58) Field of Classification Search
CPC .... H10B 12/315; H10B 12/34; H10B 12/482; H10B 12/50; H10B 12/09
See application file for complete search history.

(56)      References Cited

U.S. PATENT DOCUMENTS 7,859,042 B2      12/2010  Park et al.
9,029,957 B2      5/2015   Yoon
(Continued)

FOREIGN PATENT DOCUMENTS

CN          1909211 A      2/2007
CN          112117323 A    12/2020
(Continued)

*Primary Examiner* — Monica D Harrison
*Assistant Examiner* — Scott E Bauman
(74) *Attorney, Agent, or Firm* — Wolf, Greenfield & Sacks, P.C.

(57)          ABSTRACT
Disclosed are semiconductor memory devices and their fabrication methods. The method comprises providing a substrate including a cell array region and a boundary region, forming a device isolation layer that defines active sections on an upper portion of the substrate on the cell array region, forming an intermediate layer on the substrate on the boundary region, forming on the substrate an electrode layer that covers the intermediate layer on the boundary region, forming a capping layer on the electrode layer, forming an additional capping pattern including providing a first step difference to the capping layer on the boundary region, and allowing the additional capping pattern, the capping layer, and the electrode layer to proceed an etching process to form bit lines that run across the active sections. During the etching process, the electrode layer is simultaneously exposed on the cell array region and the boundary region.

7 Claims, 27 Drawing Sheets

(56)                    References Cited

U.S. PATENT DOCUMENTS

| | | | |
|---|---|---|---|
| 10,332,894 B2 | 6/2019 | Jung et al. | |
| 10,475,797 B2 | 11/2019 | Kebuchi | |
| 10,679,997 B2 | 6/2020 | Jung et al. | |
| 10,784,266 B2 | 9/2020 | Kim et al. | |
| 10,910,363 B2 | 2/2021 | Lee et al. | |
| 11,222,897 B2 | 1/2022 | Park et al. | |
| 11,362,031 B2 | 6/2022 | Lee et al. | |
| 2012/0001267 A1* | 1/2012 | Lee | H01L 21/28061 |
| | | | 257/E27.06 |
| 2018/0226411 A1* | 8/2018 | Jung | H10B 10/12 |
| 2019/0206875 A1 | 7/2019 | Kim et al. | |
| 2019/0326278 A1* | 10/2019 | Lee | H01L 21/76832 |
| 2020/0127103 A1* | 4/2020 | Kim | H10D 64/62 |
| 2021/0050221 A1* | 2/2021 | Kim | H01L 21/31144 |
| 2021/0057339 A1* | 2/2021 | Lee | H01L 23/5228 |
| 2021/0125998 A1* | 4/2021 | Kim | H10B 12/50 |
| 2021/0391259 A1* | 12/2021 | Ahn | H10D 62/115 |

FOREIGN PATENT DOCUMENTS

| | | | |
|---|---|---|---|
| KR | 20180092185 A | 8/2018 | |
| KR | 20190123559 A | 11/2019 | |
| KR | 20210022979 A | 3/2021 | |

* cited by examiner

Figure 6B:
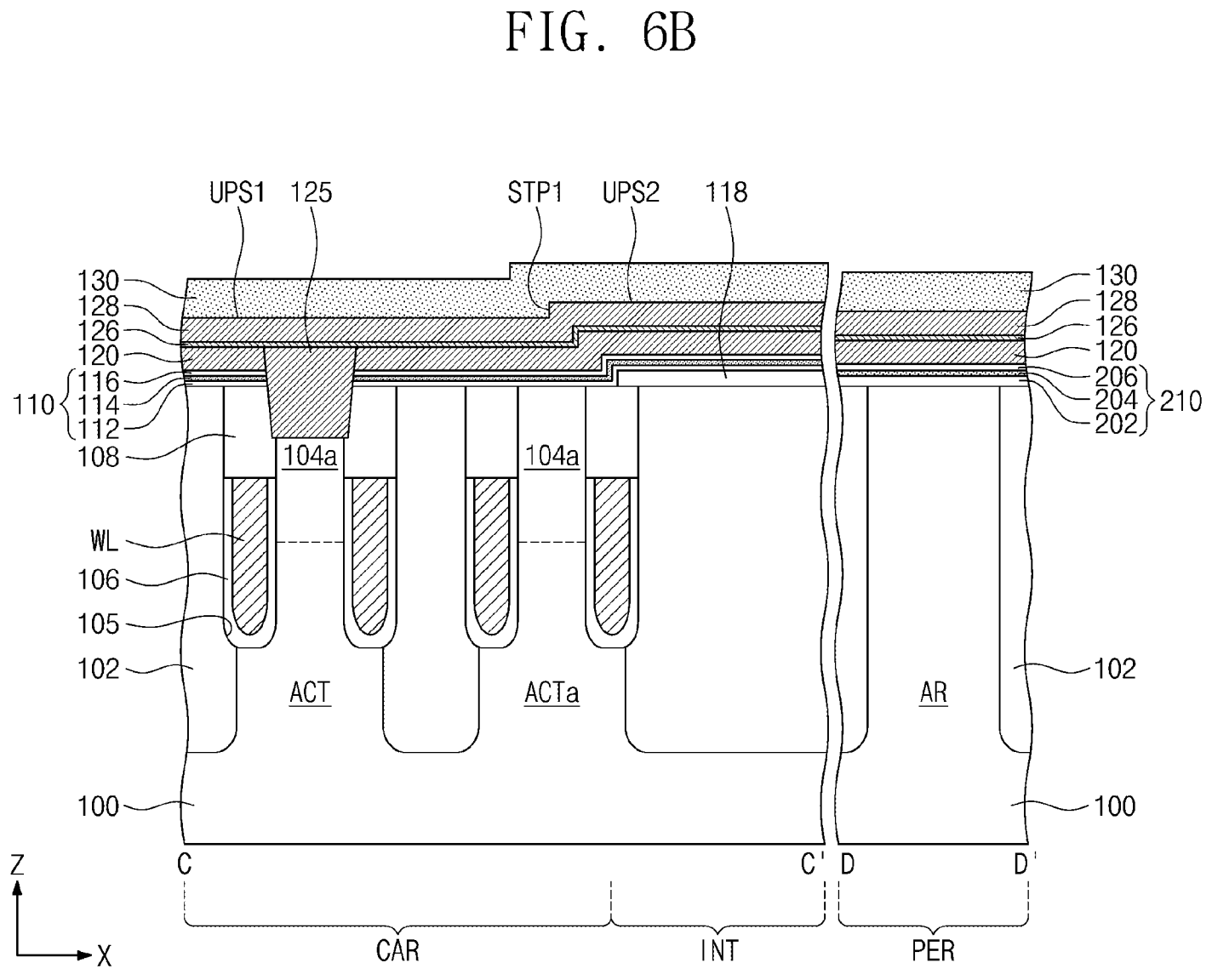

Figure 7B:
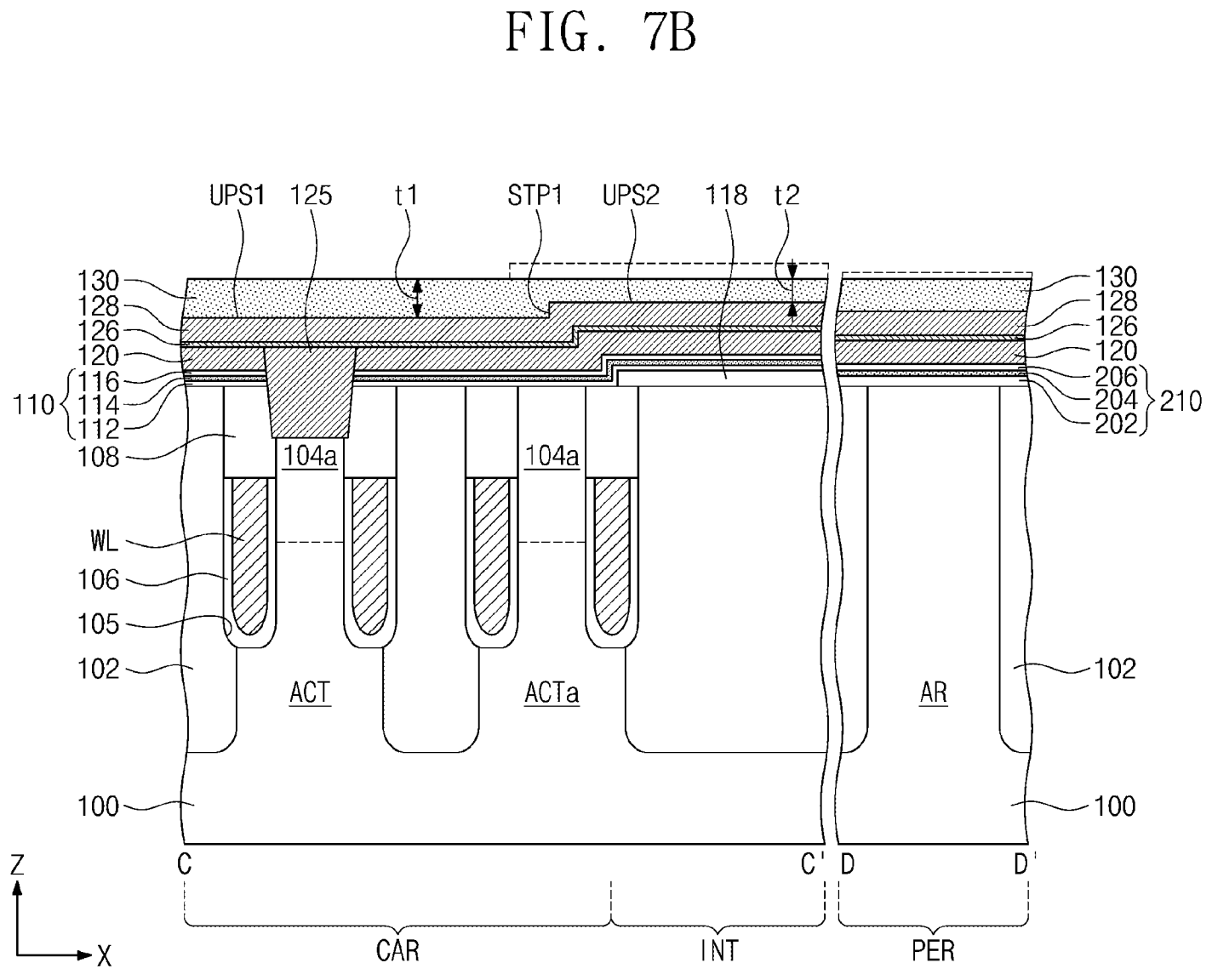

Figure 8B:
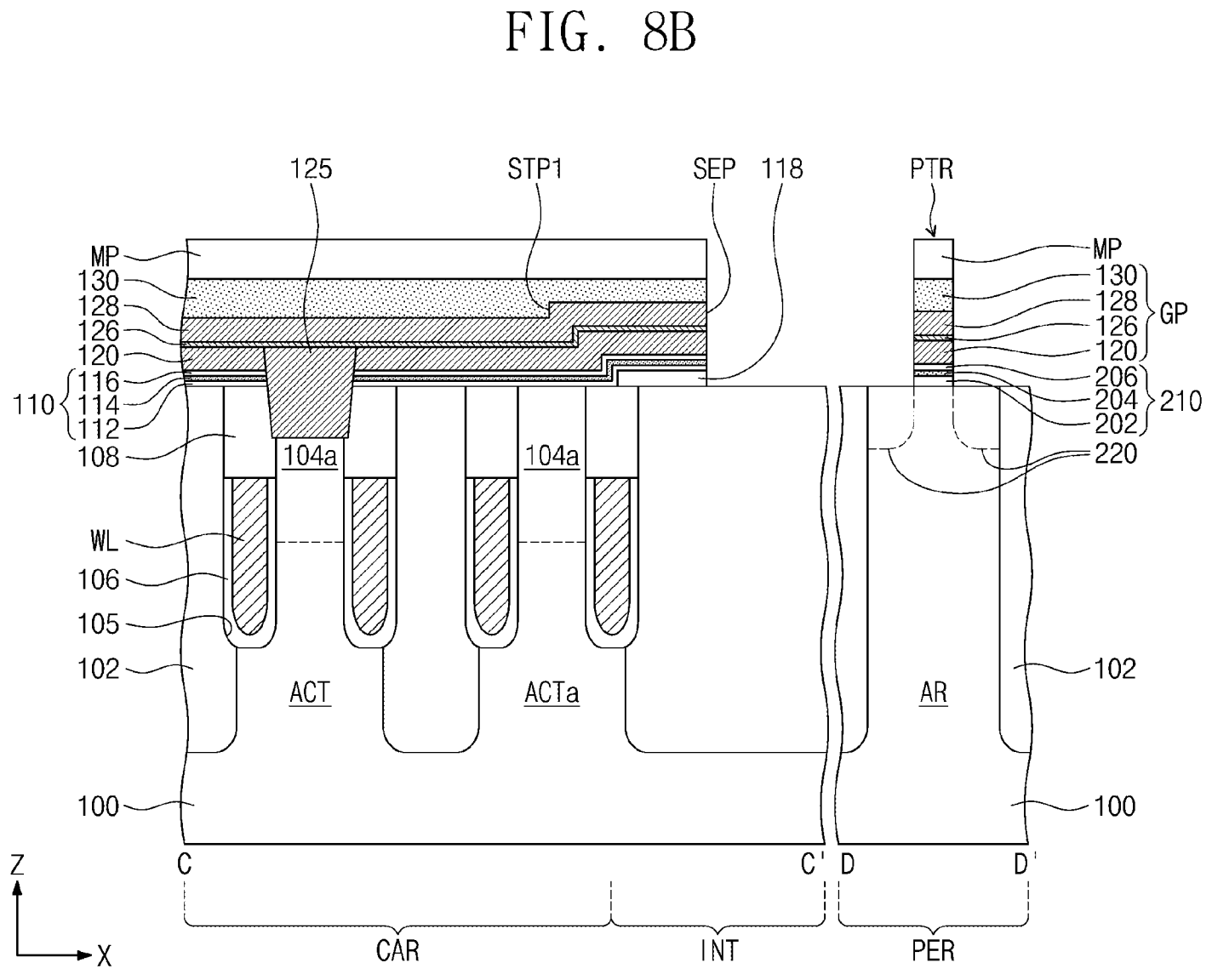

METHOD OF FABRICATING SEMICONDUCTOR MEMORY DEVICE INCLUDING CAPPING LAYER

CROSS-REFERENCE TO RELATED APPLICATION

This U.S. nonprovisional application claims priority under 35 U.S.C § 119 to Korean Patent Application No. 10-2021-0101971, filed on Aug. 3, 2021 in the Korean Intellectual Property Office, the disclosure of which is hereby incorporated by reference in its entirety.

FIELD

The present inventive concepts relate to a semiconductor memory device and a method of fabricating the same.

BACKGROUND

Semiconductor devices have an important role in the electronic industry because of their small size, multi-functionality, and/or low fabrication cost. Semiconductor devices have increasingly integrated with the development of the electronic industry. Line widths of patterns of semiconductor devices are being reduced for high integration thereof. However, new exposure techniques and/or expensive exposure techniques are required for fineness of the patterns such that it is difficult to highly integrate semiconductor devices. Various studies have thus recently been conducted for new integration techniques.

SUMMARY

Some embodiments of the present inventive concepts provide a method of fabricating a semiconductor memory device and a semiconductor memory device fabricated by the same with a low fail rate.

Some embodiments of the present inventive concepts provide a semiconductor memory device with increased reliability and improved structural stability.

According to some embodiments of the present inventive concepts, a method of fabricating a semiconductor memory device may include: providing a substrate that includes a cell array region and a boundary region; forming a device isolation layer that defines a plurality of active sections on an upper portion of the substrate on the cell array region; forming an intermediate layer on the substrate on the boundary region; forming on the substrate an electrode layer that covers the intermediate layer on the boundary region; forming a capping layer on the electrode layer; forming an additional capping pattern including providing a first step difference to the capping layer on the boundary region; and allowing the additional capping pattern, the capping layer, and the electrode layer to proceed an etching process to form a plurality of bit lines that run across the active sections. During the etching process, the electrode layer may be simultaneously exposed on the cell array region and the boundary region.

According to some embodiments of the present inventive concepts, a semiconductor memory device may include: a substrate that includes a cell array region and a boundary region; an intermediate layer on the substrate on the boundary region; a bit line that runs across the substrate on the cell array region and extends onto the boundary region to cover the intermediate layer on the boundary region, a top surface of the bit line including a step difference on the boundary region; a bit-line capping pattern on the bit line; and an additional capping pattern on the bit-line capping pattern on the boundary region. A top surface of the bit-line capping pattern may be a flat surface that is parallel to a top surface of the substrate. A first thickness of the bit-line capping pattern on the cell array region may be the same as a sum of a second thickness of the bit-line capping pattern on the boundary region and a third thickness of the additional capping pattern on the boundary region.

According to some embodiments of the present inventive concepts, a method of fabricating a semiconductor memory device may include: forming a device isolation layer that defines a plurality of active sections on a cell array region of a substrate; forming a gate dielectric structure on a peripheral circuit region of the substrate, the gate dielectric structure extending onto a boundary region between the cell array region and the peripheral circuit region; forming a buffer layer on an entire surface of the substrate, the buffer layer including a step difference on the boundary region; forming an electrode layer on the buffer layer, the electrode layer including a step difference on the boundary region; forming a first capping layer on the electrode layer; performing a planarization process on the first capping layer; forming a peripheral gate pattern by performing a first etching process on the first capping layer and the electrode layer on the peripheral circuit region; forming a second capping layer on the first capping layer; forming an additional capping pattern on the first capping layer and the second capping layer, the additional capping pattern covering the step differences of the buffer layer and the electrode layer; and allowing the additional capping pattern, the first and second capping layers, and the electrode layer to undergo an etching process to form a plurality of bit lines that run across the active sections. The etching process may include: a first phase in which the first and second capping layers are etched or the additional capping pattern is etched to expose the electrode layer; and a second phase in which the electrode layer is etched. A time during which the second phase is executed on the cell array region may be the same as a time during which the second phase is executed on the peripheral circuit region.

BRIEF DESCRIPTION OF THE DRAWINGS

FIGS. 3A to 11A and 14A illustrate cross-sectional views taken along a first direction of FIG. 2, showing a method of fabricating a semiconductor memory device according to some embodiments of the present inventive concepts.

FIGS. 3B to 11B and 14B illustrate cross-sectional views taken along a second direction of FIG. 2, showing a method of fabricating a semiconductor memory device according to some embodiments of the present inventive concepts.

Figure 15:
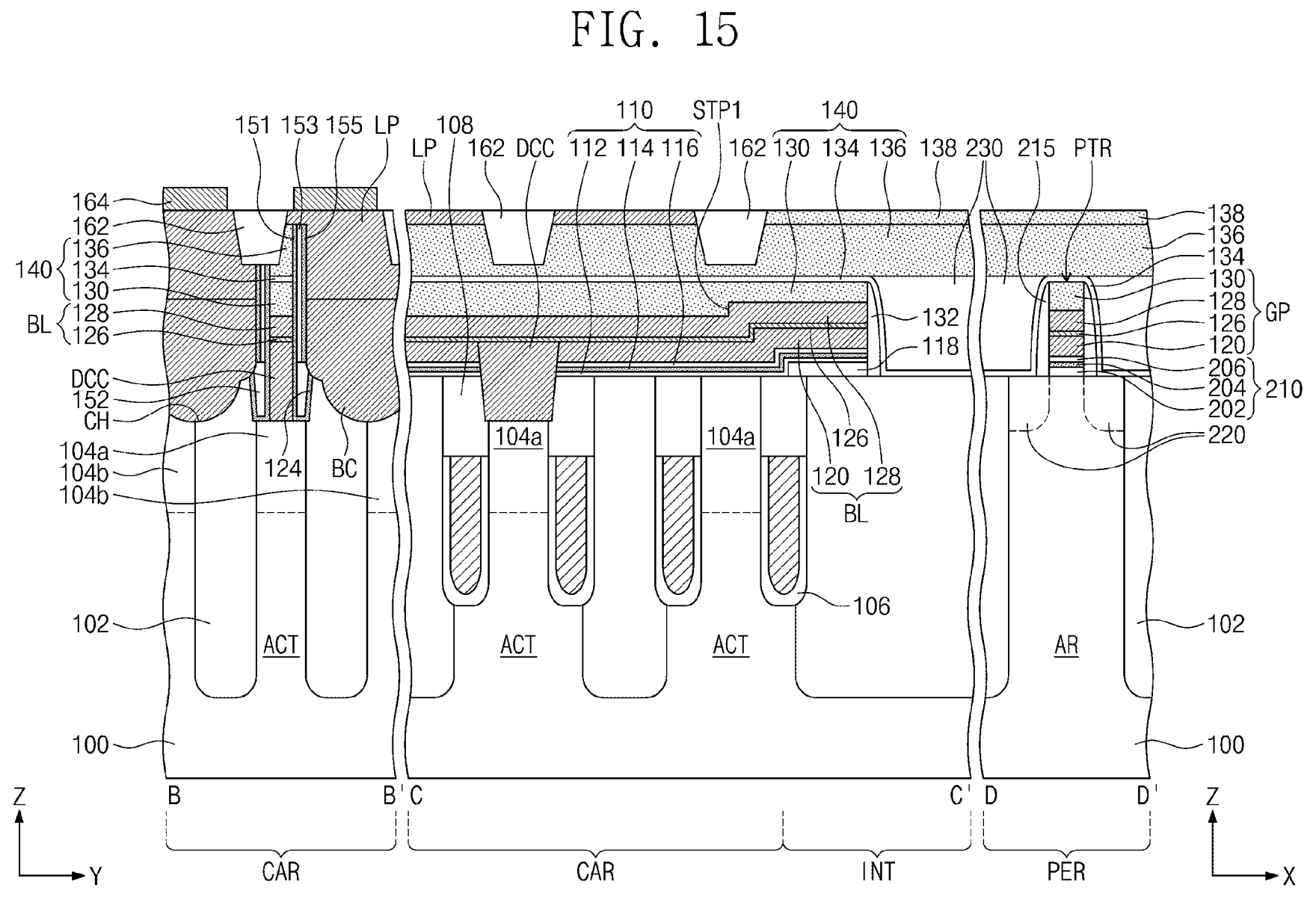

FIG. 15 illustrates a cross-sectional view showing a semiconductor memory device according to some embodiments of the present inventive concepts.

DETAILED DESCRIPTION

It will be herein described a semiconductor memory device according to the present inventive concepts with reference to the accompanying drawings.

Figure 1:
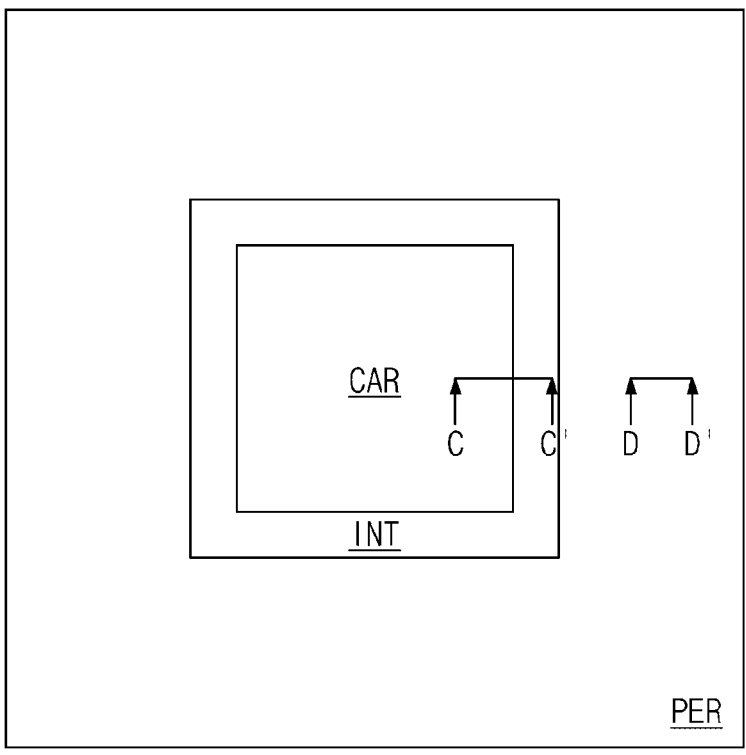
FIG. 1 illustrates a layout showing a semiconductor memory device according to some embodiments of the present inventive concepts.
Figure 2:
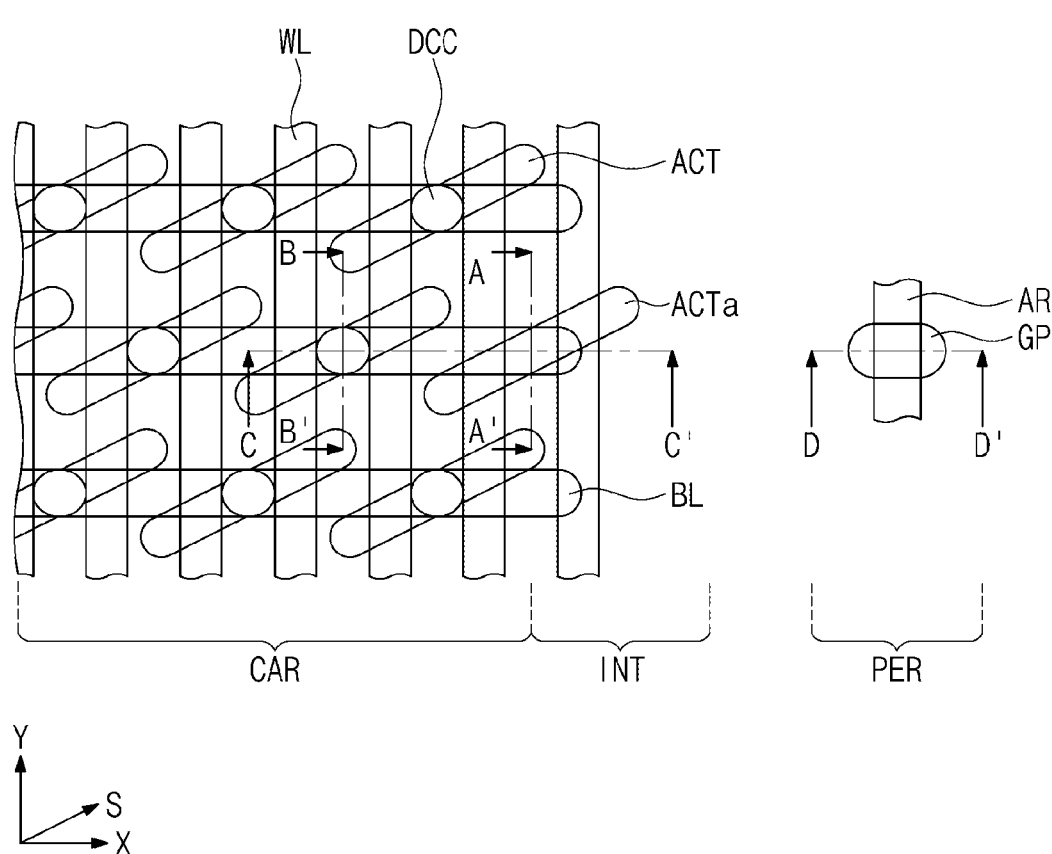
FIG. 2 illustrates a plan view showing a semiconductor memory device according to some embodiments of the present inventive concepts.
Figure 3A:
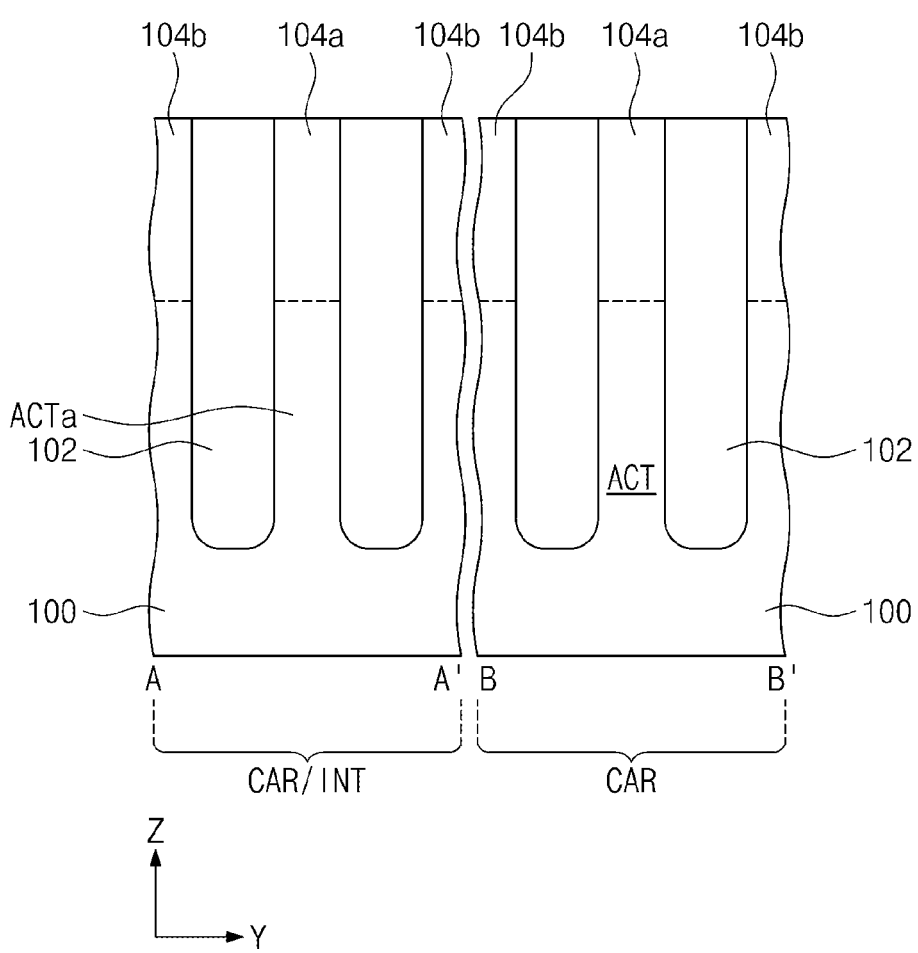
Figure 3B:
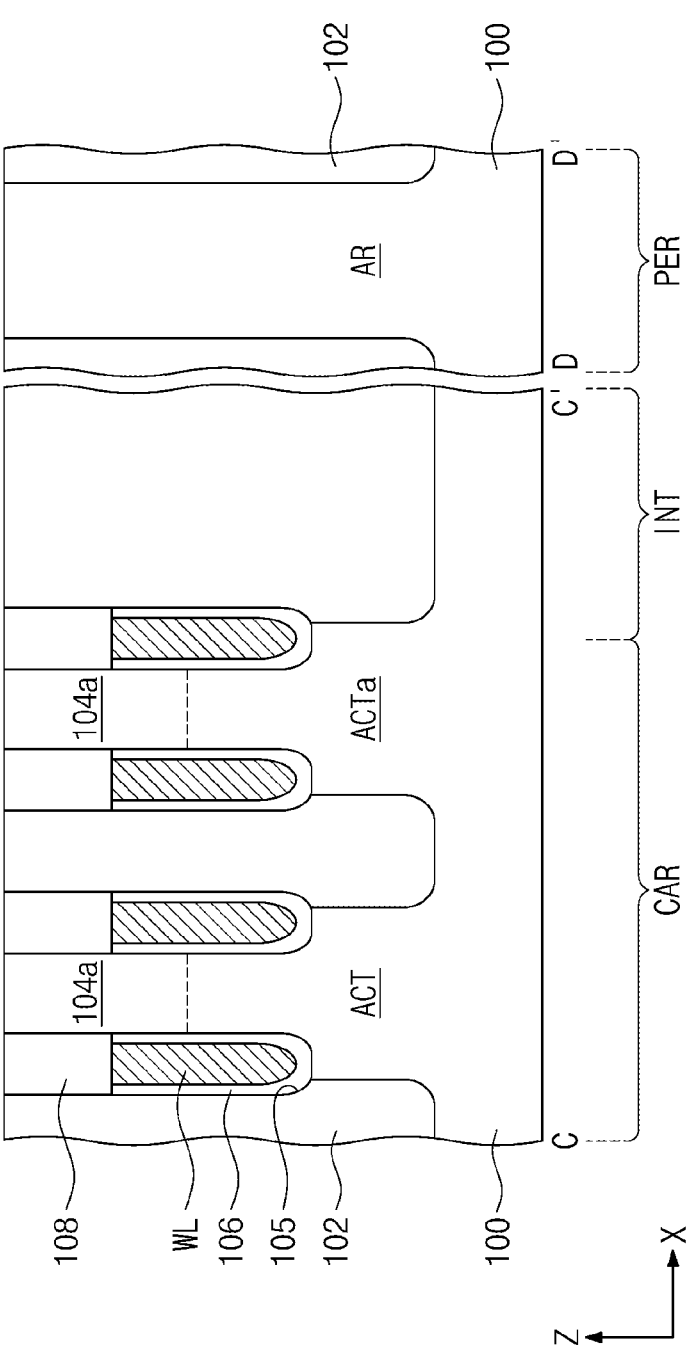
Figure 4A:
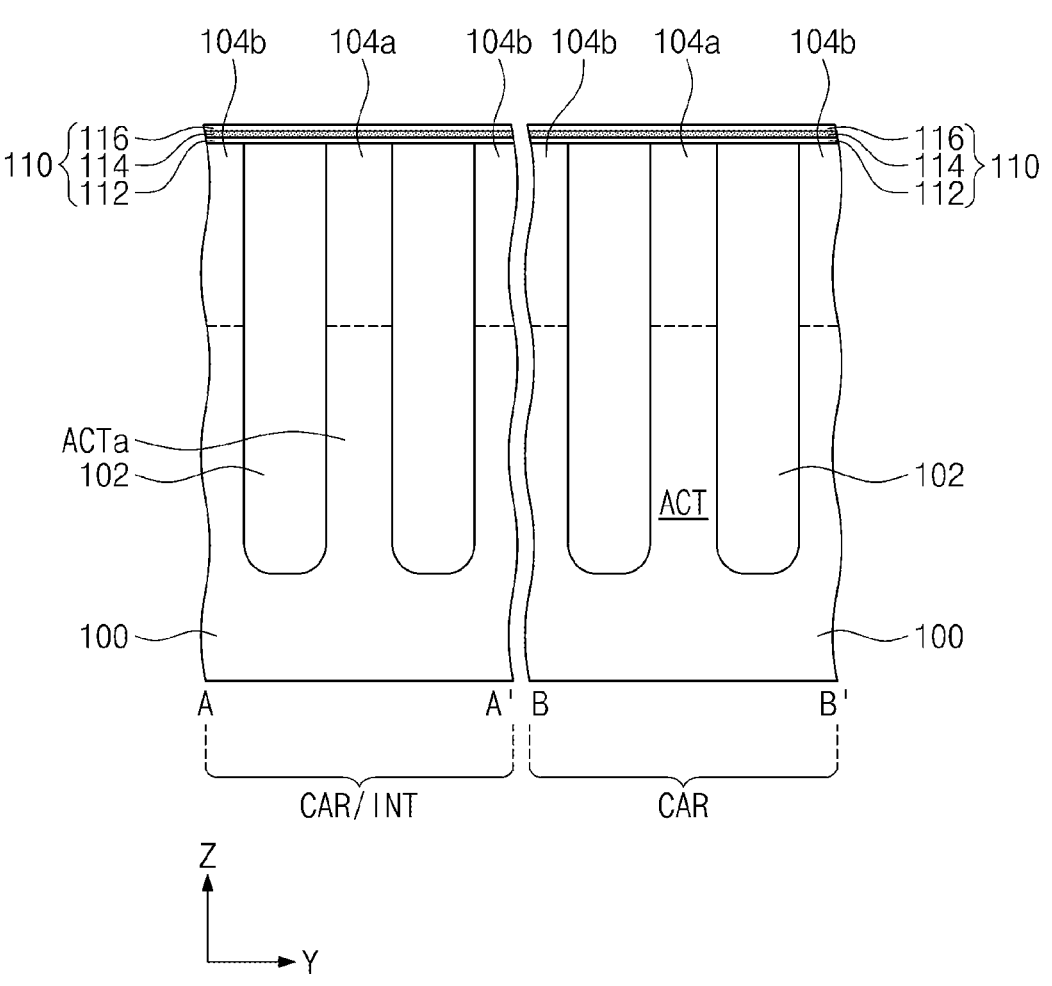
Figure 4B:
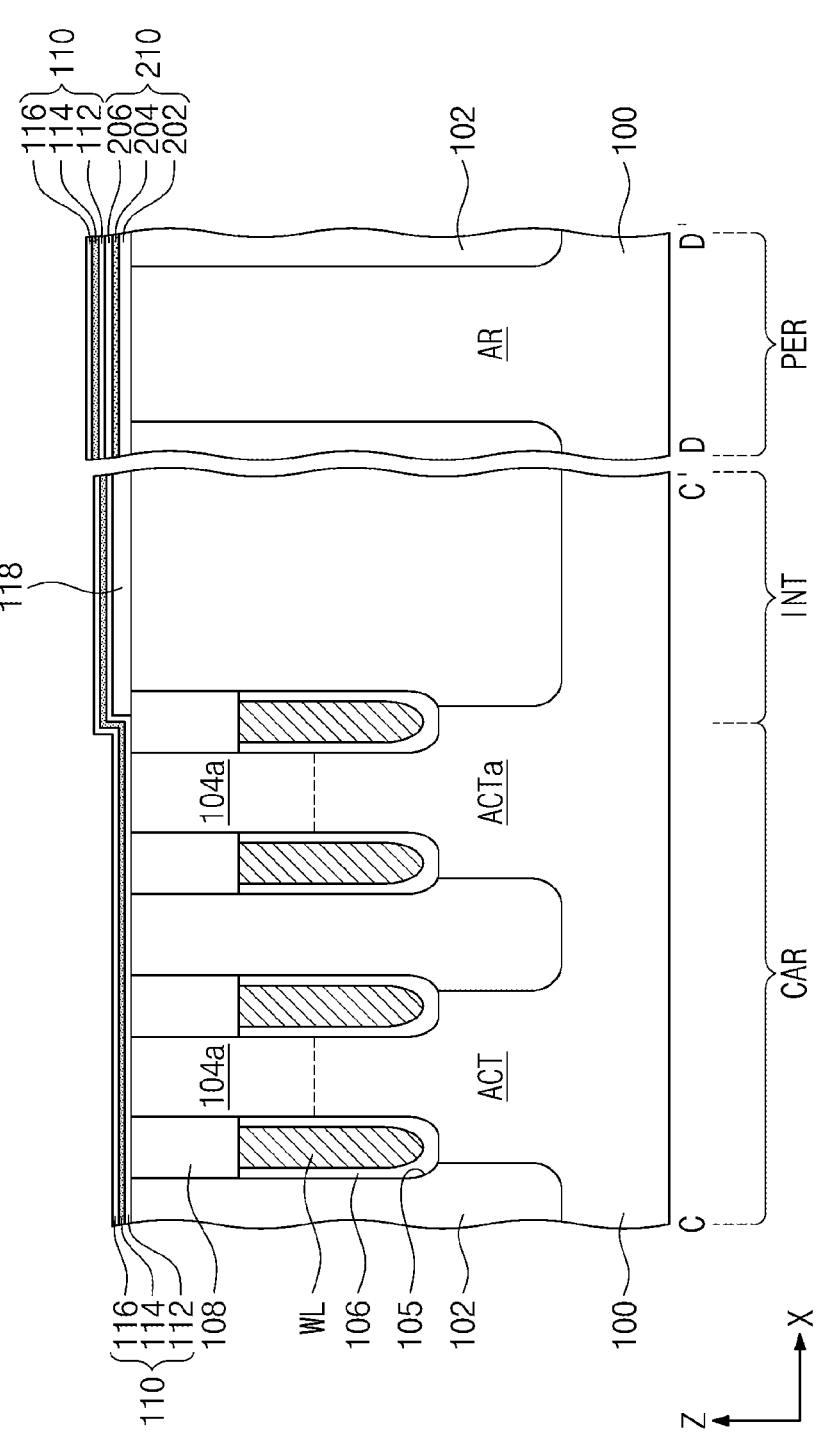

FIG. 1 illustrates a layout showing a semiconductor memory device according to some embodiments of the present inventive concepts. FIG. 2 illustrates a plan view showing a semiconductor memory device according to some embodiments of the present inventive concepts. FIGS. 3A to 11A and 14A illustrate cross-sectional views taken along a first direction of FIG. 2, showing a method of fabricating a semiconductor memory device according to some embodiments of the present inventive concepts. In FIGS. 3A to 11A and 14A, a cross-section taken along line A-A' corresponds to that of a portion of a cell array region adjacent to a boundary region, and a cross-section taken along line B-B' corresponds to that of a central portion of a cell array region. FIGS. 3B to 11B and 14B illustrate cross-sectional views taken along a second direction of FIG. 2, showing a method of fabricating a semiconductor memory device according to some embodiments of the present inventive concepts. In FIGS. 3B to 11B and 14B, a cross-section taken along line C-C' corresponds to that of a cell array region and a boundary region, and a cross-section taken along line D-D' corresponds to that of a peripheral circuit region. FIGS. 12A, 12B, 13A, and 13B illustrate cross-sectional views showing the formation of a bit line in fabricating a semiconductor memory device according to some embodiments of the present inventive concepts. FIG. 15 illustrates a cross-sectional view showing a semiconductor memory device according to some embodiments of the present inventive concepts.

Referring to FIGS. 1, 2, 3A, and 3B, there may be formed a semiconductor substrate 100 which may be referred to hereinafter as a substrate. The substrate 100 may be a bulk silicon substrate, a silicon-on-insulator (SOI) substrate, a germanium substrate, a germanium-on-insulator (GOI) substrate, a silicon-germanium substrate, a III-V group compound semiconductor substrate, or an epitaxial thin-film substrate obtained by performing selective epitaxial growth (SEG). In the drawings, a first direction X and a second direction Y are defined to indicate directions that are parallel to a top surface of the substrate 100 and orthogonal to each other. A third direction S is defined to indicate a direction that is parallel to the top surface of the substrate 100 and intersects both of the first and second directions X and Y. A fourth direction Z is defined to indicate a direction perpendicular to the top surface of the substrate 100.

The substrate 100 may include a cell array region CAR, a peripheral circuit region PER, and a boundary region INT between the cell array region CAR and the peripheral circuit region PER. The cell array region CAR may be a zone on which semiconductor cells are disposed to form an array, the peripheral circuit region PER may be a zone where peripheral circuits are disposed, such as word-line decoder or sense amplifier circuit, that apply or sense electrical signals to or from word lines WL and bit lines BL disposed on the cell array region CAR. The peripheral circuits may have at least one peripheral transistor PTR. The boundary region INT may correspond to a peripheral part of the cell array region CAR, and may be provided thereon with ends of the word lines WL or the bit lines BL disposed on the cell array region CAR. In this description, the boundary region INT is illustrated to line in the first direction X of the cell array region CAR, but the present inventive concepts are not limited thereto. The boundary region INT may be positioned in the second direction Y of the cell array region CAR, or regardless of direction, the boundary region INT may surround the cell array region CAR while extending along an outer portion of the cell array region CAR.

A device isolation layer 102 including a dielectric material may be formed in the substrate 100. The device isolation layer 102 may be formed by etching the substrate 100 to form a device isolation trench in the substrate 100 and filling the device isolation trench with a dielectric material (e.g., silicon oxide). The device isolation layer 102 may define cell active sections ACT of the substrate 100 on the cell array region CAR and also define a peripheral active section AR on the peripheral circuit region PER. When viewed in a plan view, the cell active sections ACT may correspond to portions of the substrate 100 that are surrounded by the device isolation layer 102. Each of the cell active sections ACT may have an isolated shape or be isolated from one another. The cell active sections ACT may each have a bar shape elongated in the third direction S. The cell active sections ACT may be parallel to each other in the third direction S. The cell active sections ACT may have their ends that are arranged adjacent to centers of neighboring other cell active sections ACT. The boundary region INT may be provided with one ACTa of the cell active sections ACT, or the cell array region CAR may be provided with the cell active section ACTa on its portion adjacent to the boundary region INT. The one ACTa of the cell active sections ACT may be disposed adjacent to an end of the bit line (see BL of FIG. 2) formed in a process which will be discussed below. For example, the one ACTa of the cell active sections ACT may intersect one of the word lines WL that is most adjacent to the boundary region INT, which word lines WL will be formed in a process which will be discussed below.

First and second impurity sections 104a and 104b may be formed in the cell active sections ACT. The first and second impurity sections 104a and 104b may be formed by an ion implantation process in which impurities are doped into the cell active sections ACT exposed by an ion implantation mask provided on the substrate 100. The first impurity section 104a may be formed on a central portion of each cell active section ACT, and a pair of second impurity sections 104b may be formed on opposite edge portions of each cell active section ACT. The first and second impurity sections 104a and 104b may each have a different conductivity type from that of the substrate 100. The first impurity section 104a may correspond to a common drain section, and the second impurity sections 104b may correspond to source sections.

Word-line trenches 105 may be formed in the substrate 100, running across the cell active sections ACT. The word-line trenches 105 may be arranged in the first direction X and may extend in the second direction Y. Two word-line trenches 105 may be formed to run across one cell active section ACT. The word-line trenches 105 may have their bottom surfaces located at a higher vertical level than that of a bottom surface of the device isolation layer 102. Although not shown, the word-line trenches 105 may be formed to have their bottom surfaces that are relatively deeper in the device isolation layer 102 and relatively shallower in the cell active sections ACT.

A word-line dielectric layer 106 may be formed to conformally cover surfaces of the word-line trenches 105. The word-line dielectric layer 106 may include a dielectric material. The word-line dielectric layer 106 may include, for example, a silicon oxide layer, a thermal oxide layer, or a high-k dielectric layer.

Word lines WL may be formed in the word-line trenches 105 on which the word-line dielectric layer 106 is formed. For example, a conductive layer may be formed to fill the word-line trenches 105. The conductive layer and the word-line dielectric layer 106 may undergo a process, such as etch-back, to form the word lines WL that locally remain in the word-line trenches 105. The word lines WL may be formed to have their top surfaces located at a lower vertical level than that of the top surface of the substrate 100. The word lines WL may include a conductive material. For example, the word lines WL may include polysilicon, doped polysilicon, metal, or metal silicide.

A cell transistor may be constituted by each of the word lines WL and its adjacent first and second impurity sections 104a and 104b. As the word lines WL are disposed within the word-line trenches 105, the word lines WL may be provided thereunder with channel sections each of which channel lengths increases within a limited planar area.

Word-line capping patterns 108 may be formed in upper spaces of the word-line trenches 105 that are formed by removing upper portions of the word-line dielectric layer 106 and the word lines WL. The word-line capping patterns 108 may be formed on the word lines WL and may completely fill the word-line trenches 105. The word-line capping patterns 108 may have their linear shapes that extend along longitudinal directions of the word lines WL, and cover entire top surfaces of the word lines WL. The word-line capping patterns 108 may have their top surfaces located at the same level (e.g., coplanar) as that of the top surface of the substrate 100. The word-line capping patterns 108 may include a dielectric material. For example, the word-line capping patterns 108 may include a silicon oxide layer, a silicon nitride layer, or a silicon oxynitride layer.

Referring to FIGS. 1, 2, 4A, and 4B, a peripheral gate dielectric layer 202 may be formed on the substrate 100. The peripheral gate dielectric layer 202 may be formed of a silicon oxide layer, a silicon nitride layer, or a silicon oxynitride layer. The peripheral gate dielectric layer 202 may be formed on all of the cell array region CAR, the boundary region INT, and the peripheral circuit region PER.

A peripheral high-k dielectric layer 204 may be formed on the peripheral gate dielectric layer 202. For example, the peripheral high-k dielectric layer 204 may be formed by a deposition process, such as chemical vapor deposition (CVD) or atomic layer deposition (ALD). The peripheral high-k dielectric layer 204 may be formed of a material (e.g., metal oxide) whose dielectric constant is greater than that of the peripheral gate dielectric layer 202. For example, the peripheral high-k dielectric layer 204 may be formed of at least one material selected from hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). The peripheral high-k dielectric layer 204 may be formed on all of the cell array region CAR, the boundary region INT, and the peripheral circuit region PER.

A metal-containing layer 206 may be formed on the peripheral high-k dielectric layer 204. The metal-containing layer 206 may be formed of a metal-containing layer having an N-type work function or P-type work function. For example, the metal-containing layer 206 having an N-type work function may include at least one selected from lanthanum (La), lanthanum oxide (LaO), tantalum (Ta), tantalum nitride (TaN), niobium (Nb), and titanium nitride (TiN). For example, the metal-containing layer 206 having a P-type work function may include at least one selected from aluminum (Al), aluminum oxide ($Al_2O_3$), titanium nitride (TiN), tungsten nitride (WN), and ruthenium oxide ($RuO_2$). The metal-containing layer 206 may be provided to adjust a threshold voltage of a peripheral transistor (see PTR of FIG. 8B) formed on the peripheral circuit region PER. The metal-containing layer 206 may be formed on all of the cell array region CAR, the boundary region INT, and the peripheral circuit region PER.

The peripheral gate dielectric layer 202, the peripheral high-k dielectric layer 204, and the metal-containing layer 206 may constitute a peripheral gate dielectric structure 210 on the peripheral circuit region PER.

Afterwards, an etching process that uses a mask may be performed such that the peripheral gate dielectric layer 202, the peripheral high-k dielectric layer 204, and the metal-containing layer 206 may be removed from the cell array region CAR, but may remain on the peripheral circuit region PER. The peripheral gate dielectric layer 202, the peripheral high-k dielectric layer 204, and the metal-containing layer 206 may cover the peripheral active section AR on the peripheral circuit region PER. In this case, the peripheral gate dielectric structure 210 may have an end positioned on the boundary region INT.

Although not shown, before the formation of the peripheral gate dielectric layer 202 on the substrate 100, a channel layer may be formed on the substrate 100. For example, the channel layer may be formed by selective epitaxial growth (SEG). The channel layer may have a lattice constant greater than that of the substrate 100. For example, the channel layer may be formed of silicon-germanium (SiGe).

Referring still to FIGS. 1, 2, 4A, and 4B, an intermediate layer 118 may be formed on the substrate 100. The intermediate layer 118 may be formed on the boundary region INT. The intermediate layer 118 may be a layer of byproduct generated in a process that forms either memory cells on the cell array region CAR or peripheral circuits on the peripheral circuit region PER. For example, the intermediate layer 118 may be a portion of one of the channel layer and the peripheral gate dielectric structure 210 each of which remains on the boundary region INT. The present inventive concepts, however, are not limited thereto.

A first dielectric layer 112, a second dielectric layer 114, and a third dielectric layer 116 may be sequentially stacked on an entire surface of the substrate 100. The first, second, and third dielectric layers 112, 114, and 116 may constitute a buffer layer 110 on the cell array region CAR. The second dielectric layer 114 may be formed of a material having an etch selectivity with respect to the first dielectric layer 112 and the third dielectric layer 116. For example, the second dielectric layer 114 may be formed of a silicon nitride layer. The first and third dielectric layers 112 and 116 may be formed of a silicon oxide layer. The first, second, and third dielectric layers 112, 114, and 116 may cover the peripheral gate dielectric structure 210 on the peripheral circuit region PER.

As the intermediate layer 118 (e.g., the end of the peripheral gate dielectric structure 210) is positioned on the boundary region INT, the buffer layer 110 may have a step difference on the boundary region INT. For example, the buffer layer 110 may have a top surface located at a vertical level that is higher on the peripheral circuit region PER than on the cell array region CAR.

In some embodiments, the peripheral gate dielectric layer 202 may not be removed from the cell array region CAR in an etching process performed on the peripheral high-k dielectric layer 204 and the metal-containing layer 206. For example, the peripheral gate dielectric layer 202 may not be etched. The peripheral gate dielectric layer 202 positioned on the cell array region CAR may serve as the first dielectric layer 112. In this case, on the cell array region CAR, the second dielectric layer 114 and the third dielectric layer 116 may be sequentially stacked on the peripheral gate dielectric layer 202. Hereinafter, it will be hereinafter explained based on a resultant structure illustrated in FIGS. 4A and 4B.

Referring to FIGS. 1, 2, 5A, and 5B, a lower electrode layer 120 may be formed on the entire surface of the substrate 100. For example, the lower electrode layer 120 may be formed of an impurity-doped polysilicon layer. In more detail, a polysilicon layer may be wholly deposited for forming the lower electrode layer 120. After that, the polysilicon layer may undergo an ion implantation process at several times to dope the polysilicon layer with N-type or P-type impurities.

As the intermediate layer 118 (e.g., the end of the peripheral gate dielectric structure 210) is positioned on the boundary region INT, the lower electrode layer 120 may have a step difference on the boundary region INT. For example, the lower electrode layer 120 may have a top surface located at a vertical level that is higher on the peripheral circuit region PER than on the cell array region CAR. On the boundary region INT, the top surface of the lower electrode layer 120 adjacent to the cell array region CAR may be located at a lower vertical level than that of the top surface of the lower electrode layer 120 adjacent to the peripheral circuit region PER.

A first mask layer 122 may be formed on the lower electrode layer 120. The first mask layer 122 may have an opening that roughly limits a position of a bit-line contact DCC. The first mask layer 122 may be, for example, a photoresist layer, an amorphous carbon layer (ACL), a spin-on-hardmask (SOH) layer, or a spin-on-carbon (SOC) layer. A recess 124 may be formed by using the first mask layer 122 as an etching mask to partially remove the lower electrode layer 120, the buffer layer 110, and the first impurity section 104a from the cell array region CAR. In this step, an upper portion of the device isolation layer 102 may also be removed.

Figure 5A:
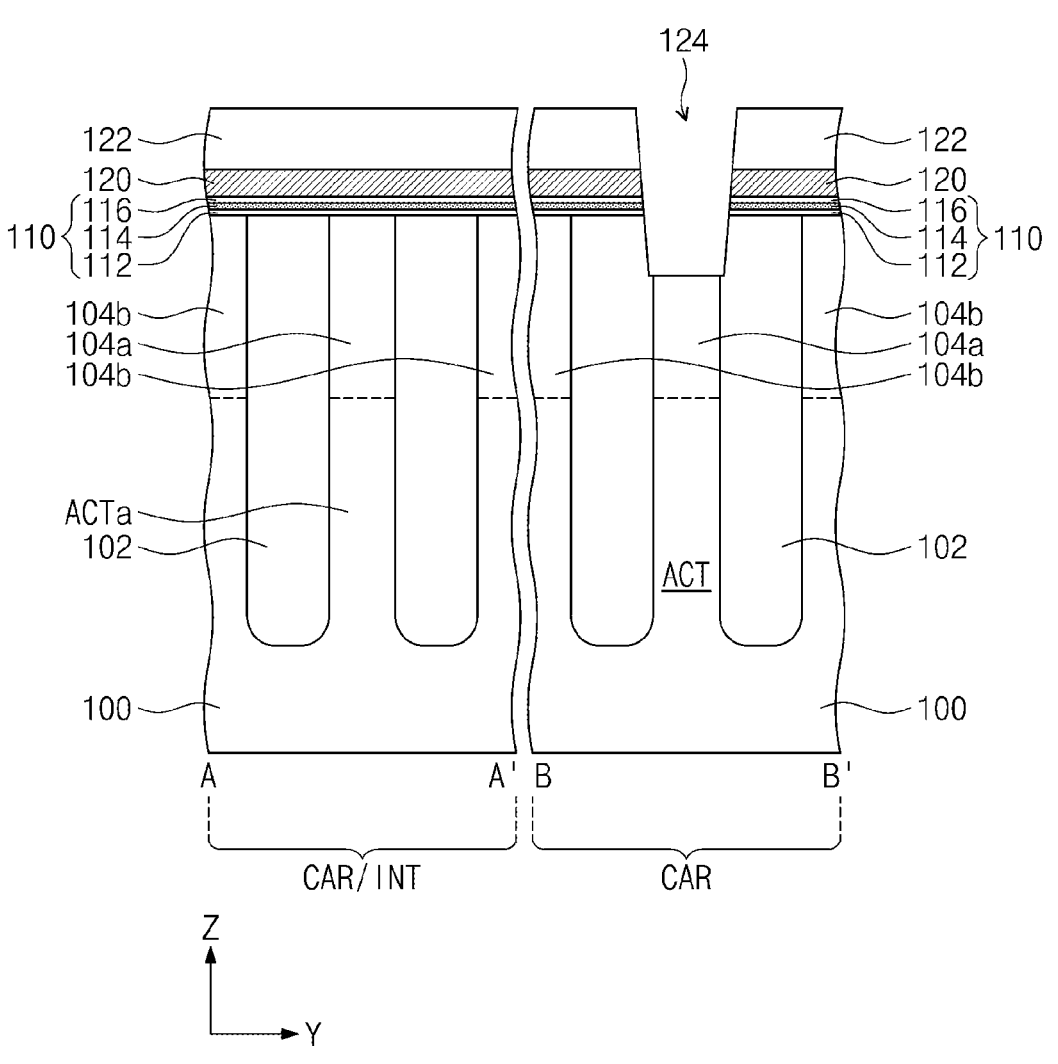
Figure 5B:
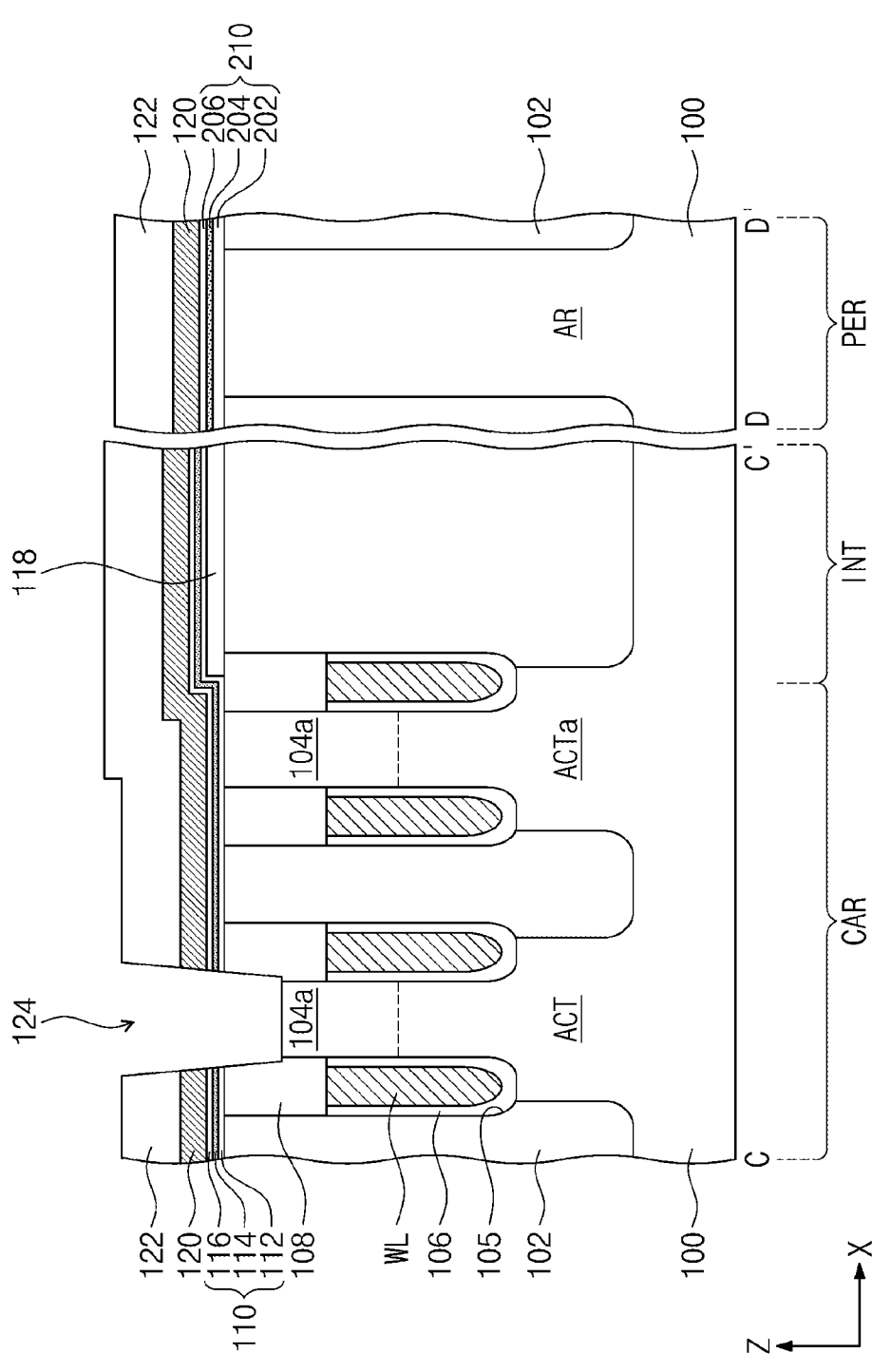
Figure 6A:
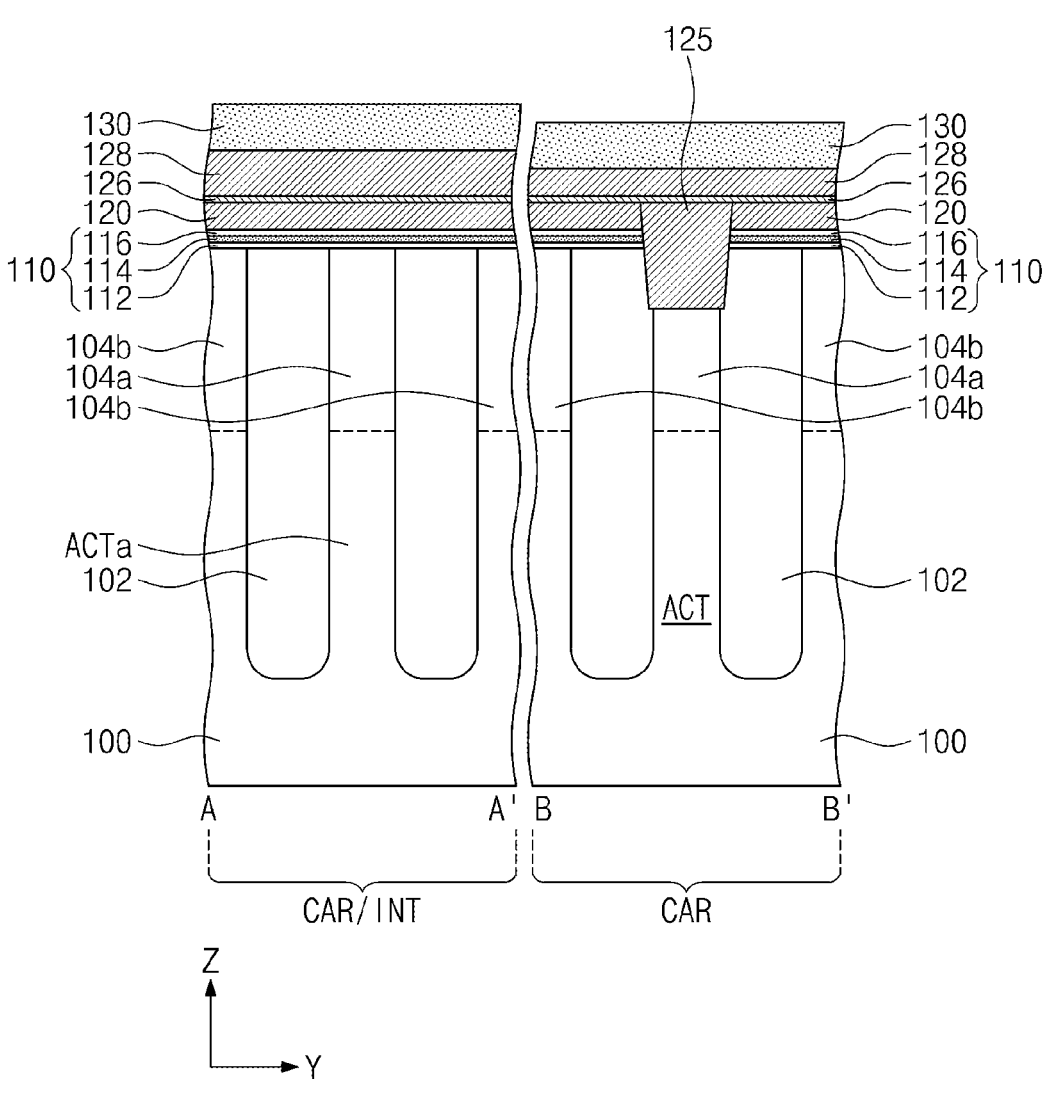
Figure 7A:
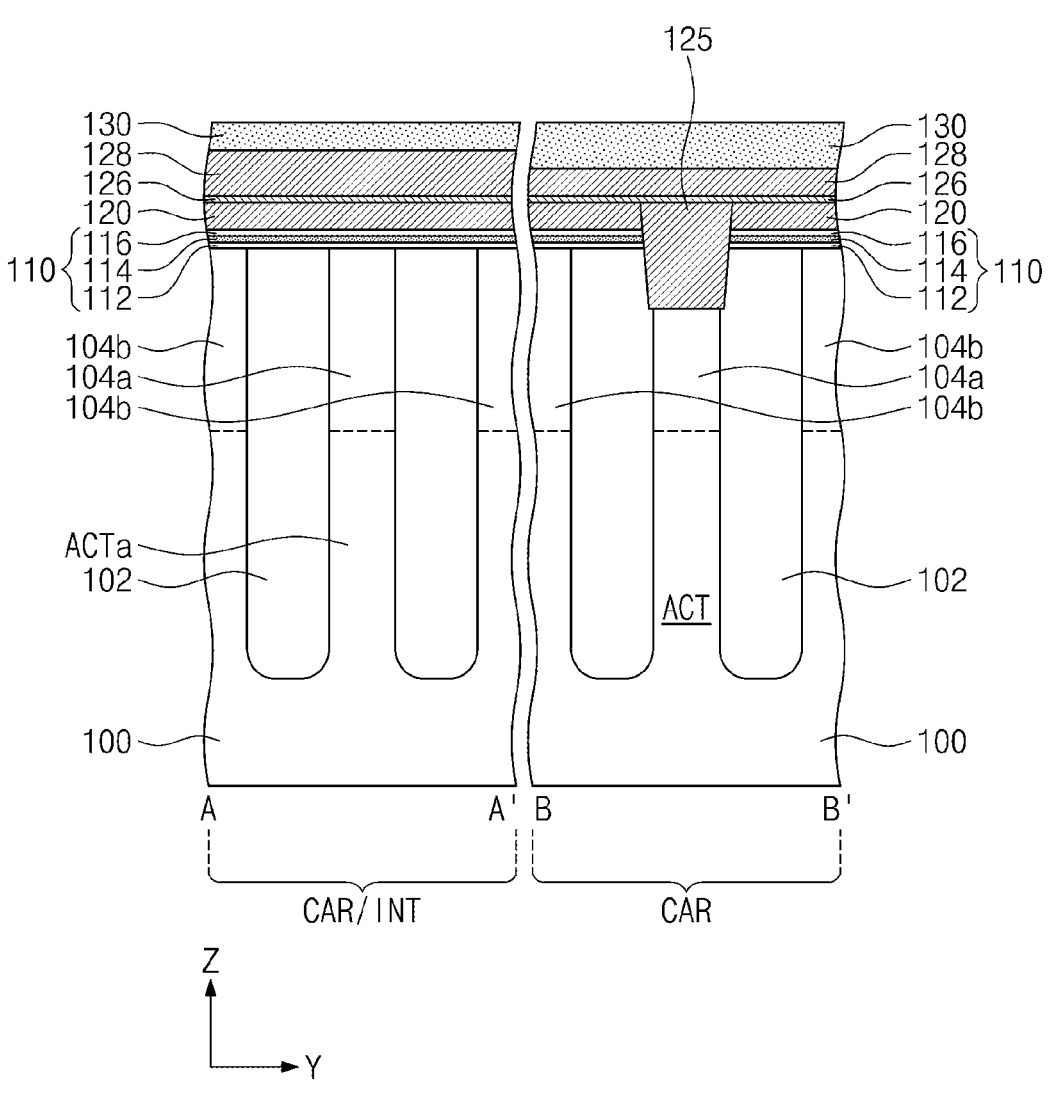
Figure 8A:
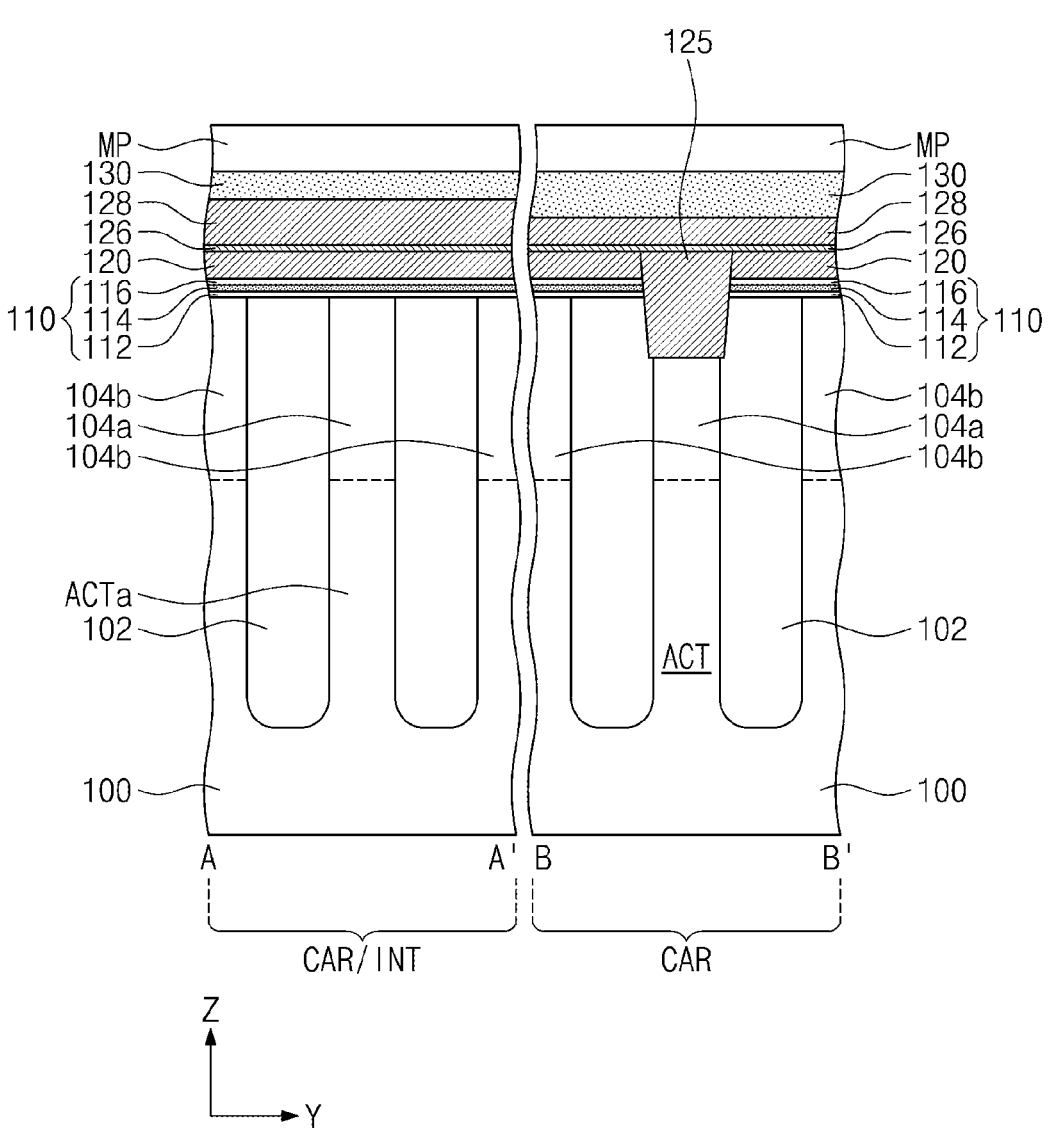
Figure 9A:
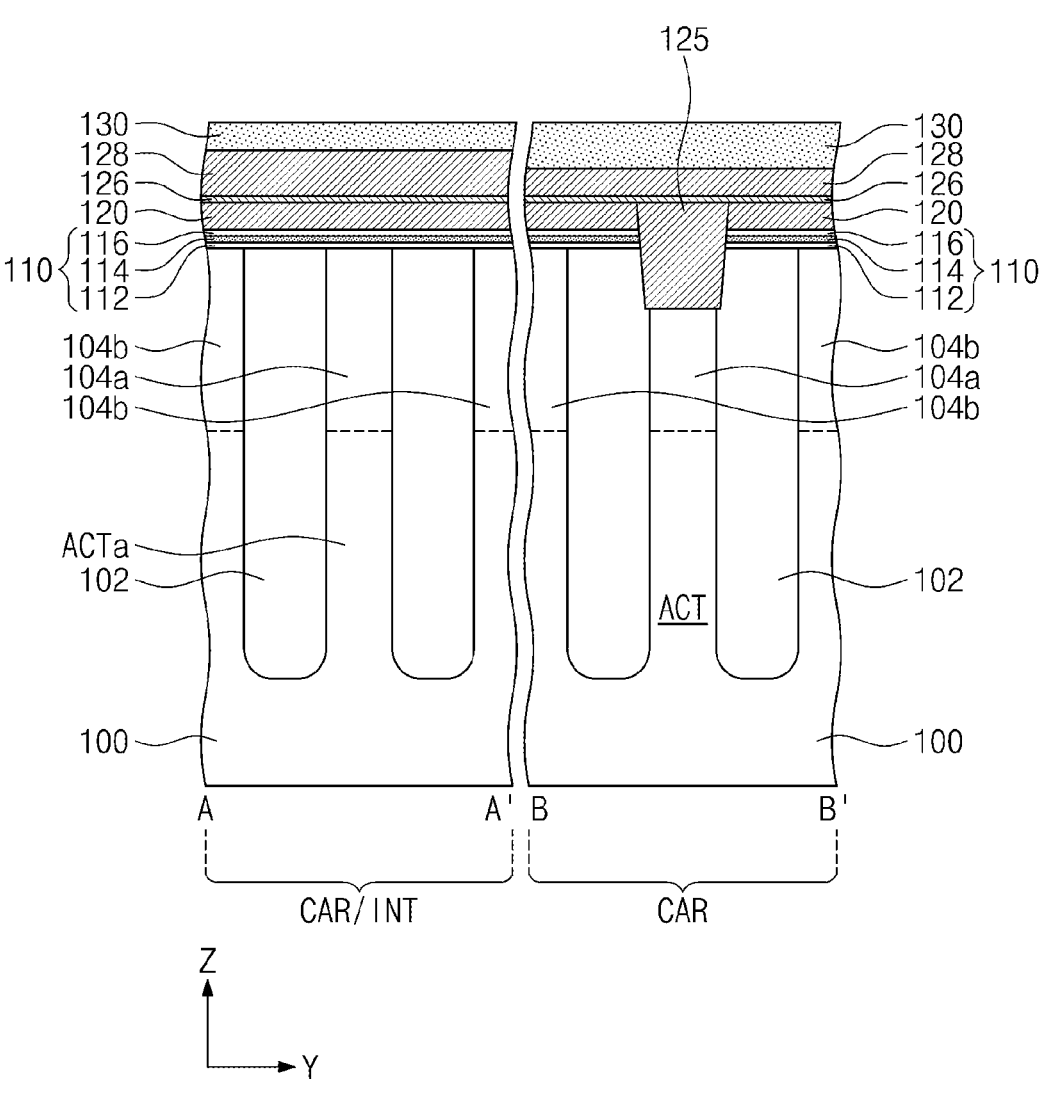
Figure 9B:
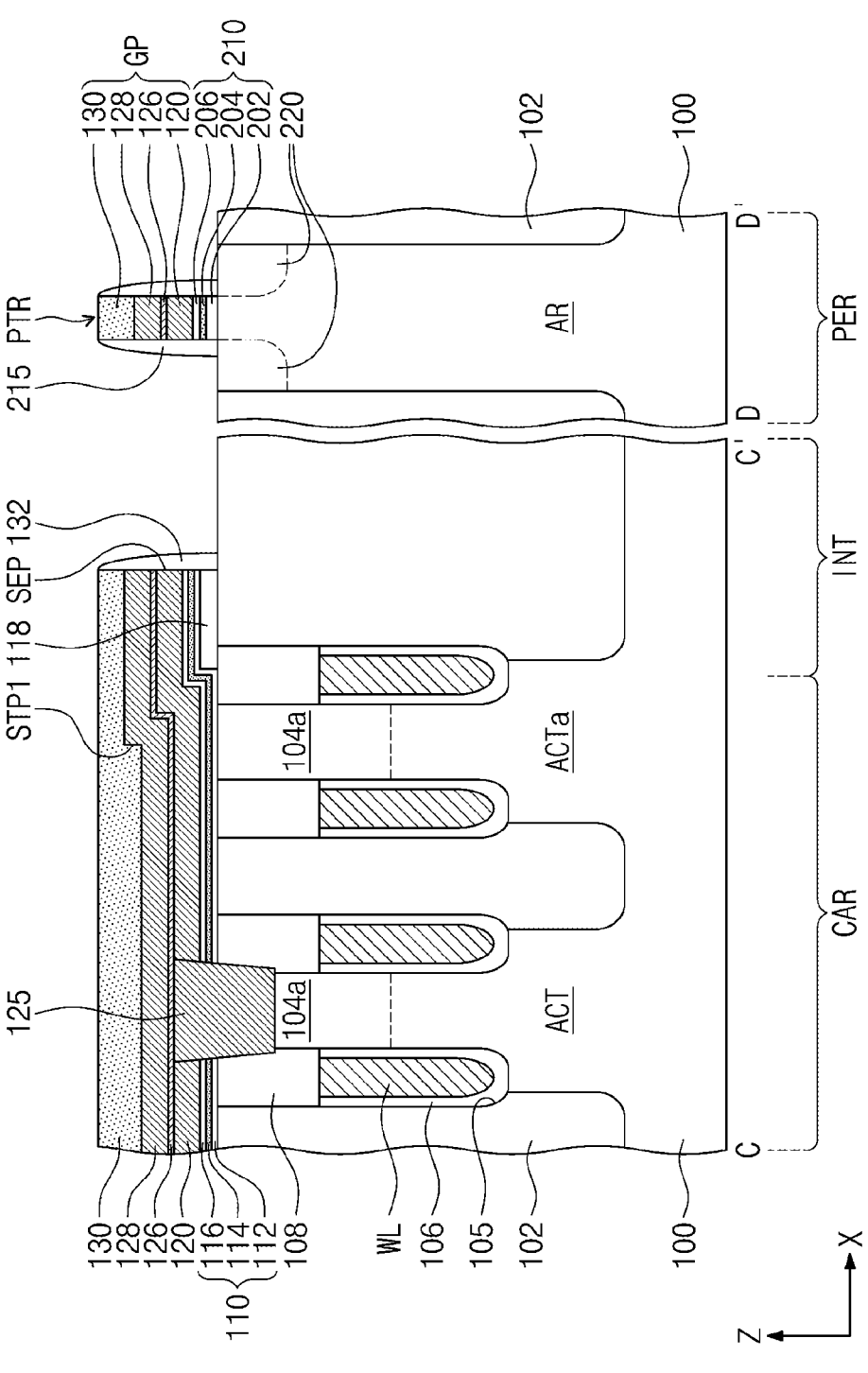
Figure 10A:
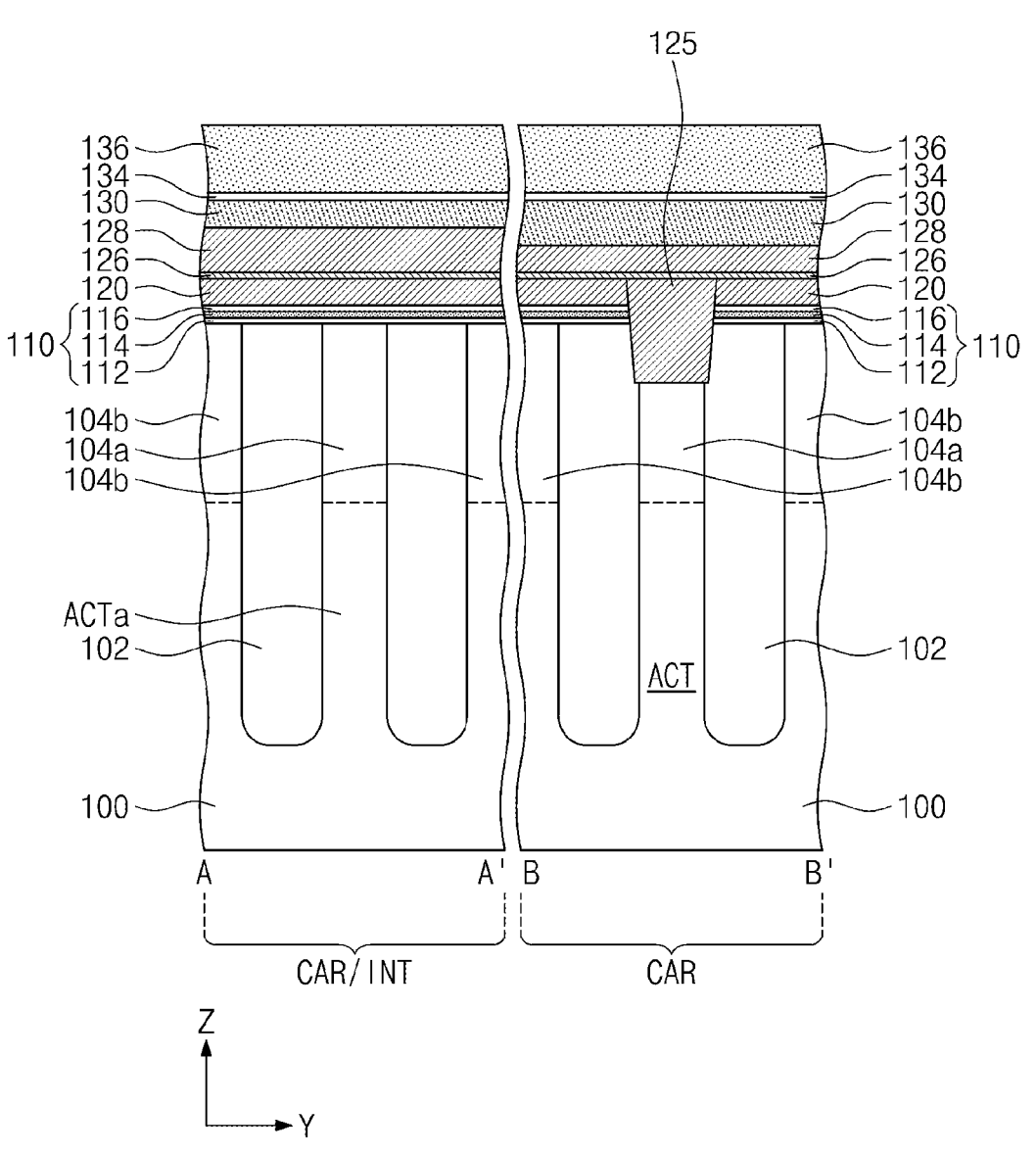
Figure 10B:
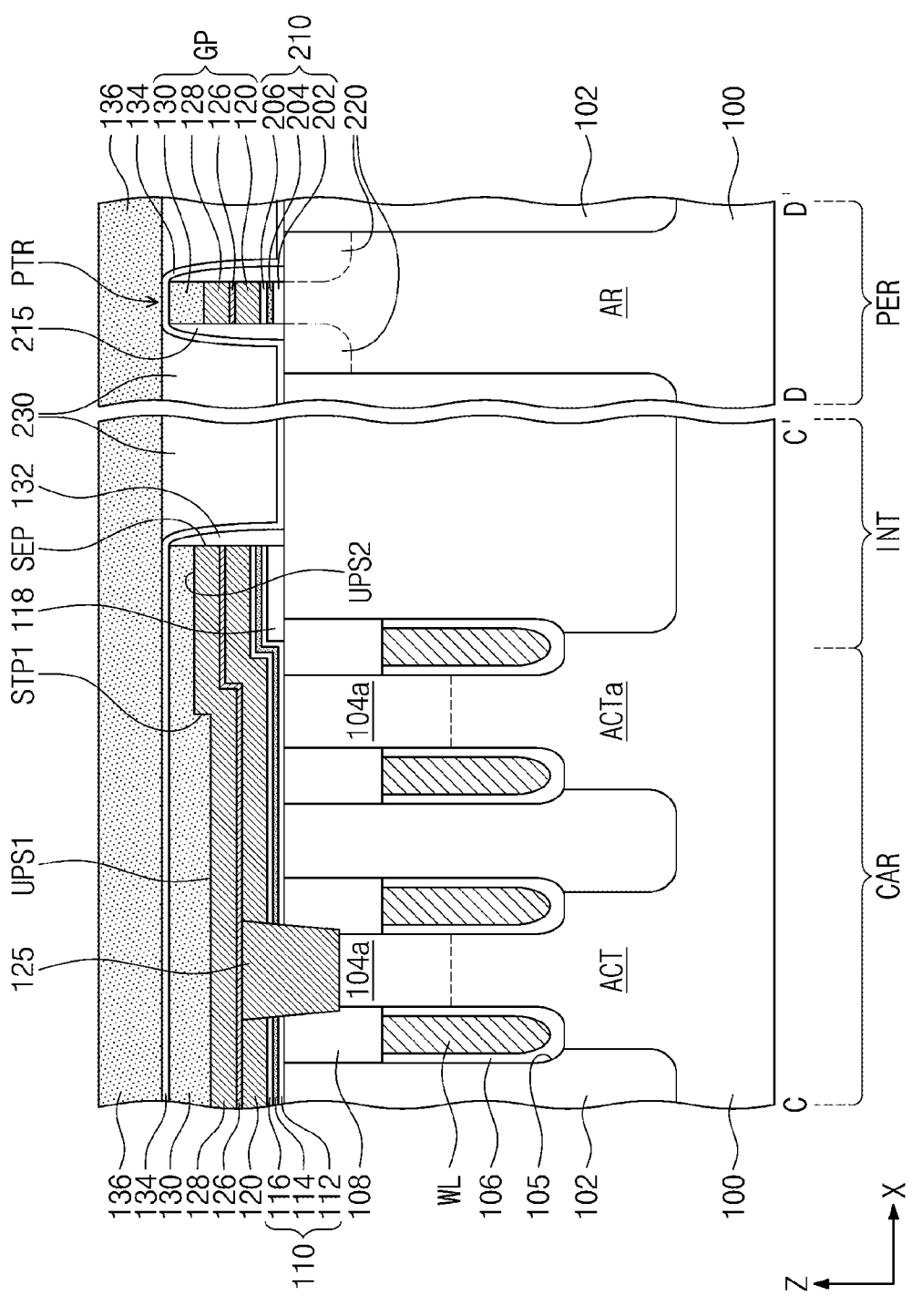

As shown in FIG. 5A, the recess 124 may not be formed on the first impurity section 104a of the cell active section ACTa adjacent to the boundary region INT. For example, the recess 124 may not be formed on an end of a bit line (see BL of FIGS. 2, 11A, and 11B), which end is directed toward the boundary region INT. The present inventive concepts, however, are not limited thereto. The recess 124 may be formed on the first impurity section 104a of the cell active section ACTa adjacent to the boundary region INT, or the cell active section ACTa may not be formed on the end of the bit line BL.

Referring to FIGS. 1, 2, 6A, and 6B, the first mask layer 122 may be removed to expose an upper portion of the lower electrode layer 120. An impurity-doped polysilicon layer may be stacked on the entire surface of the substrate 100, thereby filling the recess 124. After that, an etch-back process may be performed to form a polysilicon pattern 125 that fills the recess 124.

A diffusion stop layer 126, an upper electrode layer 128, and a first capping layer 130 may be sequentially stacked on the lower electrode layer 120 and the polysilicon pattern 125. The diffusion stop layer 126 may be at least one selected from a titanium nitride layer, a tungsten nitride layer, and a tantalum nitride layer. The upper electrode layer 128 may include one of tungsten, aluminum, and copper. The first capping layer 130 may be formed of a silicon nitride layer. For convenience of description, an electrode layer 120, 126, and 128 may be defined by a combination of the lower electrode layer 120, the diffusion stop layer 126, and the upper electrode layer 128 that are stacked on each other.

As the intermediate layer 118 (e.g., the end of the peripheral gate dielectric structure 210) is positioned on the boundary region INT, the electrode layer 120, 126, and 128 may have a first step difference STP1 on the intermediate layer 118, and the first capping layer 130 formed on the electrode layer 120, 126, and 128 may also have a step difference. The first step difference STP1 of the electrode layer 120, 126, and 128 may be positioned on either the boundary region INT or the cell array region CAR adjacent to the boundary region INT. The first step difference STP1 of the electrode layer 120, 126, and 128 may have a position that depends on a position of the intermediate layer 118, a thickness of the buffer layer 110, and/or a thickness of the electrode layer 120, 126, and 128. For convenience of description, the following will focus on an embodiment in which the first step difference STP1 of the electrode layer 120, 126, and 128 is positioned on the boundary region INT. The electrode layer 120, 126, and 128 and the first capping layer 130 may have their top surfaces located at a vertical level that is higher on the peripheral circuit region PER than on the cell array region CAR. On the boundary region INT, the electrode layer 120, 126, and 128 and the first capping layer 130 that are adjacent to the cell array region CAR may have their top surfaces located at a lower vertical level than that of a top surface of each of the first capping layer 130, the upper electrode layer 128, and the diffusion stop layer 126 that are adjacent to the peripheral circuit region PER. For example, a first top surface UPS1 of the electrode layer 120, 126, and 128 on the cell array region CAR may be located at a lower level from the substrate 100 than that of a second top surface UPS2 of the electrode layer 120, 126, and 128 on the boundary region INT.

Referring to FIGS. 1, 2, 7A, and 7B, a planarization process may be performed on the first capping layer 130. For example, a chemical mechanical polishing (CMP) process may be performed on the first capping layer 130 such that top surface of the first capping layer 130 may become substantially flat. In this case, the top surface of the first capping layer 130 may be parallel to the substrate 100 (e.g., parallel to a top surface or a bottom surface of the substrate 100). The planarization process may be performed to adjust a height of a peripheral gate pattern (see GP of FIG. 8B) included in a peripheral transistor (see PTR of FIG. 8B) formed on the peripheral circuit region PER. The planarization process may partially remove an upper portion of the first capping layer 130 on the boundary region INT. For example, the first capping layer 130 may be etched much more on the boundary region INT than on the cell array region CAR. Therefore, a first thickness t1 of the first capping layer 130 on the cell array region CAR may be greater than a second thickness t2 of the first capping layer 130 on the boundary region INT. A point where the first capping layer 130 changes in thickness may vertically correspond to or may be vertically aligned with the first step difference STP1 of the upper electrode layer 128.

Referring to FIGS. 1, 2, 8A, and 8B, an etching process may be performed in which a mask MP is used to etch the first capping layer 130, the electrode layer 120, 126, and 128, and the peripheral gate dielectric structure 210, thereby forming a peripheral gate pattern GP. In this step, the first capping layer 130, the electrode layer 120, 126, and 128, the buffer layer 110, and the intermediate layer 118 may remain on the cell array region CAR. The first capping layer 130 and the electrode layer 120, 126, and 128 may cover a portion of the boundary region INT. For example, the boundary region INT may be provided thereon with an end SEP of a combination of the first capping layer 130, the electrode layer 120, 126, and 128, the buffer layer 110, and the intermediate layer 118, which end SEP is formed by the etching process. On the boundary region INT, the first capping layer 130, the electrode layer 120, 126, and 128, the buffer layer 110, and the intermediate layer 118 may be etched to partially expose a top surface of the device isolation layer 102.

Peripheral source/drain sections 220 may be formed by doping impurities into the substrate 100 adjacent to the peripheral gate pattern GP. A peripheral transistor PTR may be constituted by the peripheral gate pattern GP and the peripheral source/drain sections 220.

Referring to FIGS. 1, 2, 9A, and 9B, a spacer layer may be conformally stacked on the entire surface of the substrate 100, and then the spacer layer may undergo an anisotropic etching process to form peripheral spacers 215 that cover sidewalls of the peripheral gate pattern GP. The spacer layer may cover the first capping layer 130 on the cell array region CAR, and may also be conformally formed on the end SEP of the combination of the first capping layer 130, the electrode layer 120, 126, and 128, the buffer layer 110, and the intermediate layer 118. After that, the anisotropic etching process may form an interface spacer 132 on the end SEP of the combination of the first capping layer 130, the electrode layer 120, 126, and 128, the buffer layer 110, and the intermediate layer 118.

Referring to FIGS. 1, 2, 10A, and 10B, a second capping layer 134 may be formed. For example, the second capping layer 134 may be formed by conformally depositing a dielectric layer on the entire surface of the substrate 100. The second capping layer 134 may cover the first capping layer 130 on the cell array region CAR. The second capping layer 134 may cover the peripheral transistor PTR on the peripheral circuit region PER. On the boundary region INT, the second capping layer 134 may cover the first capping layer 130 and the interface spacer 132.

A peripheral interlayer dielectric layer 230 may be formed by depositing a dielectric material on the entire surface of the substrate 100. Afterwards, the peripheral interlayer dielectric layer 230 may undergo a chemical mechanical polishing (CMP) process to expose at least a top surface of the second capping layer 134. The peripheral interlayer dielectric layer 230 may surround the peripheral transistor PTR on the peripheral circuit region PER. The peripheral interlayer dielectric layer 230 may fill a space between the peripheral transistor PTR and the interface spacer 132. The peripheral interlayer dielectric layer 230 may have a top surface coplanar with that of the second capping layer 134.

A third capping layer 136 may be formed on the second capping layer 134 and the peripheral interlayer dielectric layer 230. For example, the third capping layer 136 may be formed by depositing a dielectric material on the entire surface of the substrate 100. The third capping layer 136 may be formed of a silicon nitride layer. The third capping layer 136 may have a top surface that is substantially flat and substantially parallel to the substrate 100 (e.g., parallel or substantially parallel to a top surface or a bottom surface of the substrate 100). The third capping layer 136 may have a plate shape. For example, the third capping layer 136 may have a thickness that is substantially uniform on the cell array region CAR and the boundary region INT. For convenience of description, a capping layer 130, 134, and 136 may be defined by a combination of the first capping layer

130, the second capping layer 134, and the third capping layer 136 that are positioned on the electrode layer 120, 126, and 128.

Referring to FIGS. 1, 2, 11A, and 11B, the third capping layer 136 may be caused to form a second step difference STP2 on the boundary region INT or the cell array region CAR adjacent to the boundary region INT. The second step difference STP2 may be configured such that the third capping layer 136 may become higher in vertical level from the cell array region CAR toward the boundary region INT. In this description, based on the second step difference STP2 of the third capping layer 136, the third capping layer 136 may have a portion located at a higher level than that of a lower top surface of the third capping layer 136 (or that of the top surface of the third capping layer 136 on the cell array region CAR), and the portion of the third capping layer 136 may be defined as an additional capping pattern 138. On the boundary region INT, the additional capping pattern 138 may be formed to protrude onto or from the top surface of the third capping layer 136. For example, on the boundary region INT, a material layer may be provided on the third capping layer 136 to form the second step difference STP2. The formation of the additional capping pattern 138 may include forming on the third capping layer 136 a first mask pattern having an opening that defines an area where the additional capping pattern 138 will be formed, depositing on the first mask pattern a dielectric layer to fill the opening, and then lifting off the first mask pattern. The additional capping pattern 138 may include the same material as that of the third capping layer 136. For example, the additional capping pattern 138 may include silicon nitride. Alternatively, a dielectric layer may be deposited on the third capping layer 136, and the dielectric layer may be patterned to form the additional capping pattern 138. In this case, the additional capping pattern 138 may include a different material from that of the third capping layer 136. For example, the additional capping pattern 138 may include silicon oxide. In some embodiments, on a region other than the boundary region INT, an upper portion of the third capping layer 136 may be partially removed to form the second step difference STP2. For example, a second mask pattern may be formed on the third capping layer 136 so as to cover an area where the additional capping pattern 138 will be formed, performing an etching process on the third capping layer 136 exposed by the second mask pattern, and then removing the second mask pattern. Therefore, the top surface of the third capping layer 136 may become lowered on the cell array region CAR, and the second step difference STP2 may be formed on the boundary region INT. In this case, the additional capping pattern 138 may correspond to a portion of the third capping layer 136, and the additional capping pattern 138 and the third capping layer 136 may be provided as a single unitary body.

FIG. 11B depicts that the additional capping pattern 138 is also formed on the peripheral circuit region PER, but the present inventive concepts are not limited thereto. The additional capping pattern 138 may be formed only on the boundary region INT, and may not be formed on the peripheral circuit region PER.

The first step difference STP1 of the electrode layer 120, 126, and 128 may induce a reduction in thickness of the capping layer 130, 134, and 136 on the boundary region INT, and the additional capping pattern 138 may be provided to compensate the reduction in thickness of the capping layer 130, 134, and 136. For example, the additional capping pattern 138 may be positioned on or over the intermediate layer 118. In more detail, the additional capping pattern 138 may be located on or over the first step difference STP1 of the electrode layer 120, 126, and 128. When viewed in a plan view, the additional capping pattern 138 may cover a second top surface UPS2 of the electrode layer 120, 126, and 128. The additional capping pattern 138 may have an end that is vertically aligned with the first step difference STP1 of the electrode layer 120, 126, and 128. The additional capping pattern 138 may have a third thickness t3 substantially same as a fourth thickness or height t4 of the first step difference STP1 of the electrode layer 120, 126, and 128. Therefore, a fifth thickness t5 of the capping layer 130, 134, and 136 on the cell array region CAR may be substantially same as a sum of a sixth thickness t6 of the capping layer 130, 134, and 136 on the boundary region INT and the third thickness t3 of the additional capping pattern 138 (the sixth thickness t6 corresponds to a distance between a bottom surface of the capping layer 130, 134, and 136 and a bottom surface of the additional capping pattern 138). In this case, the first step difference STP1 may have a height substantially same as that of the second step difference STP2. A distance between a first top surface UPS1 of the electrode layer 120, 126, and 128 on the cell array region CAR and the top surface of the capping layer 130, 134, and 136 on the cell array region CAR may be substantially same as a distance between the second top surface UPS2 of the electrode layer 120, 126, and 128 on the boundary region INT and the top surface of the additional capping pattern 138 on the boundary region INT. For example, a sum of the fifth thickness t5 of the capping layer 130, 134, and 136 and the third thickness t3 of the additional capping pattern 138 may be constant on the boundary region INT and the cell array region CAR (the third thickness t3 corresponds to zero on the cell array region CAR).

An etching process may be performed such that a bit-line mask pattern BMP may be used as an etching mask to etch the capping layer 130, 134, and 136 and the electrode layer 120, 126, and 128 on the cell array region CAR to thereby form a bit-line capping pattern 140 and a bit line BL. In the etching process, the polysilicon pattern 125 in the recess 124 may also be etched to form a bit-line contact DCC (see, e.g., FIGS. 14A and 14B). In this step, the recess 124 may be exposed on its sidewall and also be partially exposed on its bottom surface.

Figure 11A:
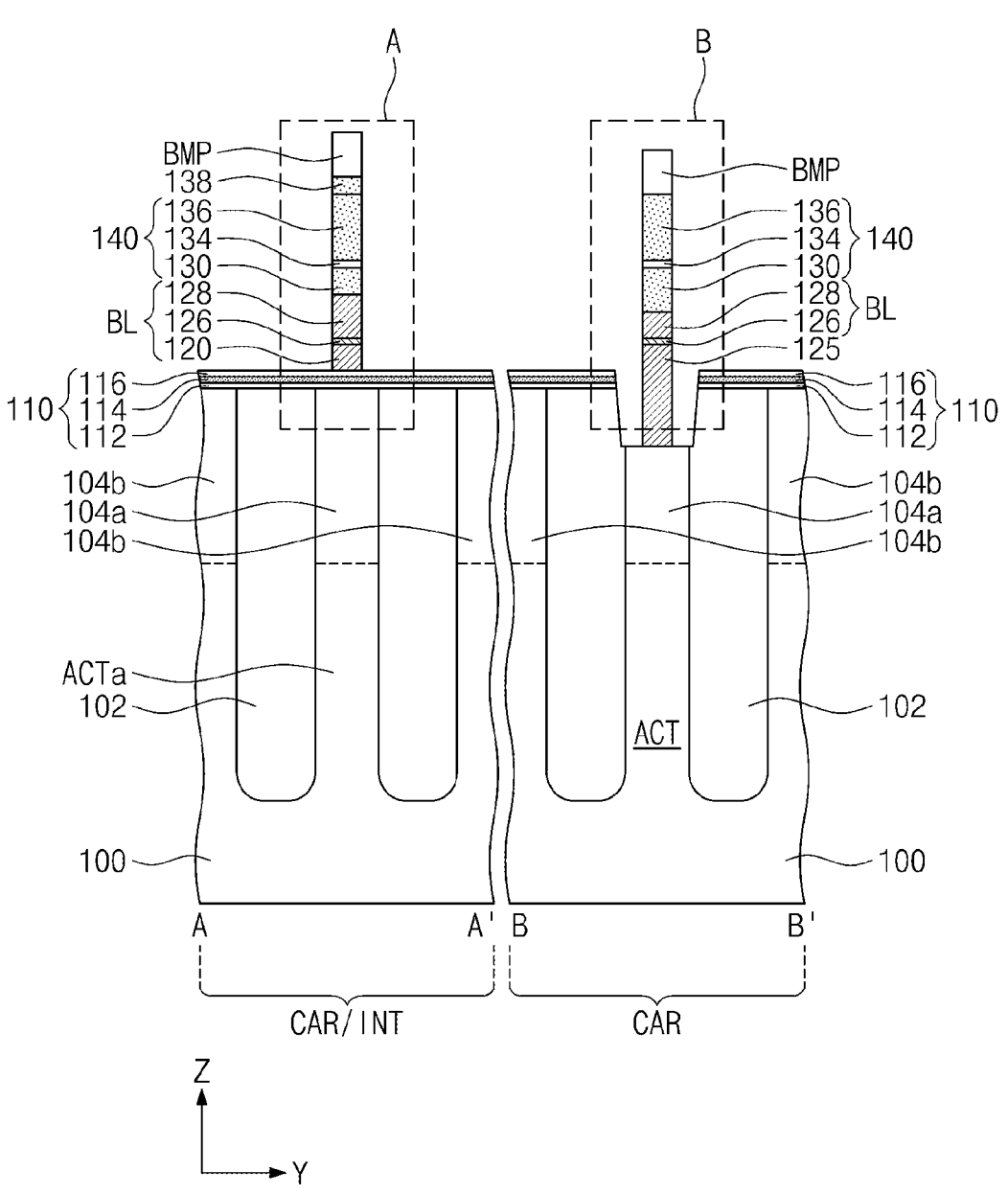
Figure 11B:
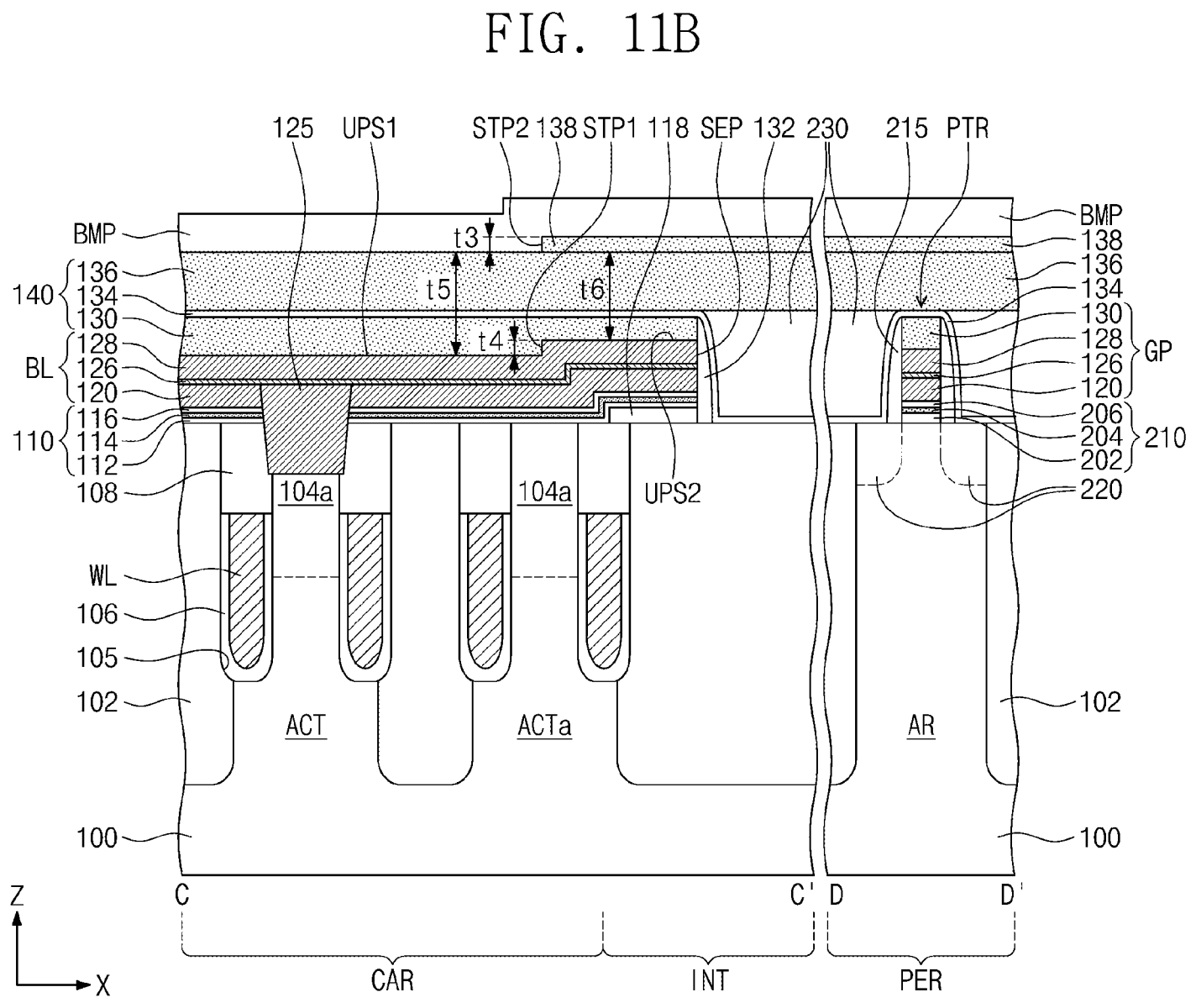

FIGS. 12A, 12B, 13A, and 13B illustrate enlarged cross-sectional views of sections A and B of FIG. 11A, showing the formation of a bit line in a semiconductor memory fabrication method according to some embodiments of the present inventive concepts. The following will describe in detail the formation of the bit line BL and the bit-line contact DCC with reference to FIGS. 12A and 12B.

An etching process for forming the bit-line capping pattern 140 and the bit line BL may have a first phase that etches the capping layer 130, 134, and 136 and a second phase that etches the electrode layer 120, 126, and 128.

Figure 12A:
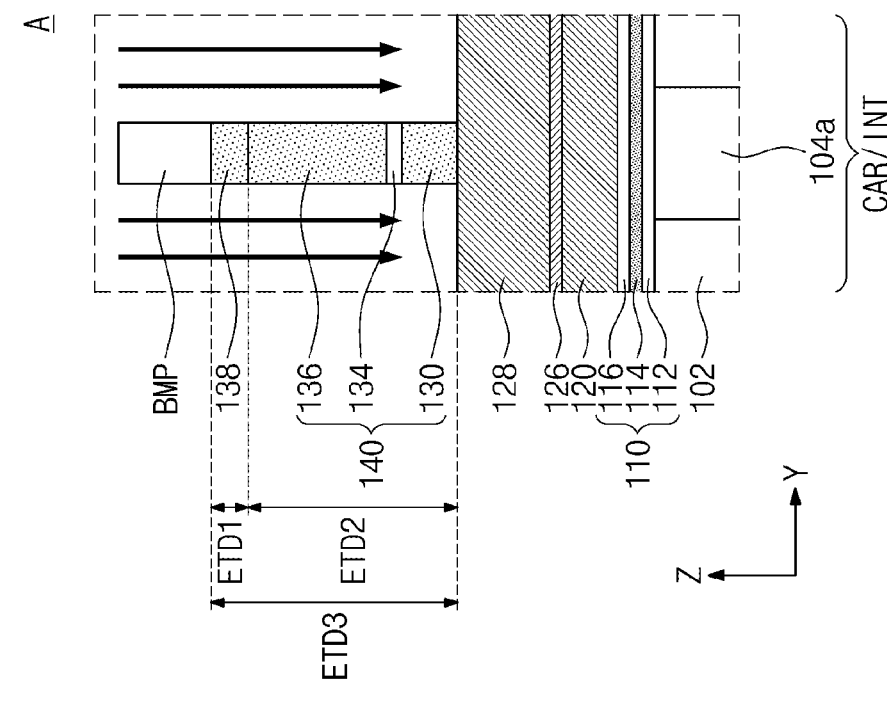
FIGS. 12A, 12B, 13A, and 13B illustrate cross-sectional views showing the formation of a bit line in fabricating a semiconductor memory device according to some embodiments of the present inventive concepts.

Referring to FIG. 12A, in the first phase of the etching process, the etching process may be performed which uses the bit-line mask pattern BMP as an etching mask on the cell array region CAR and the boundary region INT.

As depicted in section A, the first phase of the etching process may be performed on the boundary region INT or a portion of the cell array region CAR, which portion is adjacent to the boundary region INT. For convenience, the following description will focus on the boundary region INT. First, the additional capping pattern 138 may undergo the etching process to etch the addition capping pattern 138 to a first etching depth ETD1. Afterwards, the etching process may be continuously performed on the exposed capping layer 130, 134, and 136 such that the capping layer 130, 134, and 136 may be etched to a second etching depth ETD2. The first phase of the etching process may be executed to expose the top surface of the electrode layer 120, 126, and 128 on the boundary region INT. On the boundary region INT, a third etching depth ETD3 achieved during the first phase may correspond to a sum of the first etching depth ETD1 and the second etching depth ETD2.

As depicted in section B, the first phase of the etching process may be performed on the cell array region CAR. The etching process may be performed on the capping layer 130, 134, and 136 such that the capping layer 130, 134, and 136 may be etched to a fourth etching depth ETD4. The first phase of the etching process may be executed to expose the top surface of the electrode layer 120, 126, and 128 on the cell array region CAR.

In the etching process performed during the first phase, the third etching depth ETD3 on the boundary region INT may be same as the fourth etching depth ETD4 on the cell array region CAR. Therefore, a first process time it takes for the additional capping pattern 138 and the capping layer 130, 134, and 136 to be etched to expose the top surface of the electrode layer 120, 126, and 128 on the boundary region INT may be same as a second process time it takes for the capping layer 130, 134, and 136 to be etched to expose the top surface of the electrode layer 120, 126, and 128 on the cell array region CAR. For example, as the first phase of the etching process is executed, the top surface of the electrode layer 120, 126, and 128 may be simultaneously exposed on the boundary region INT and the cell array region CAR.

Figure 12B:
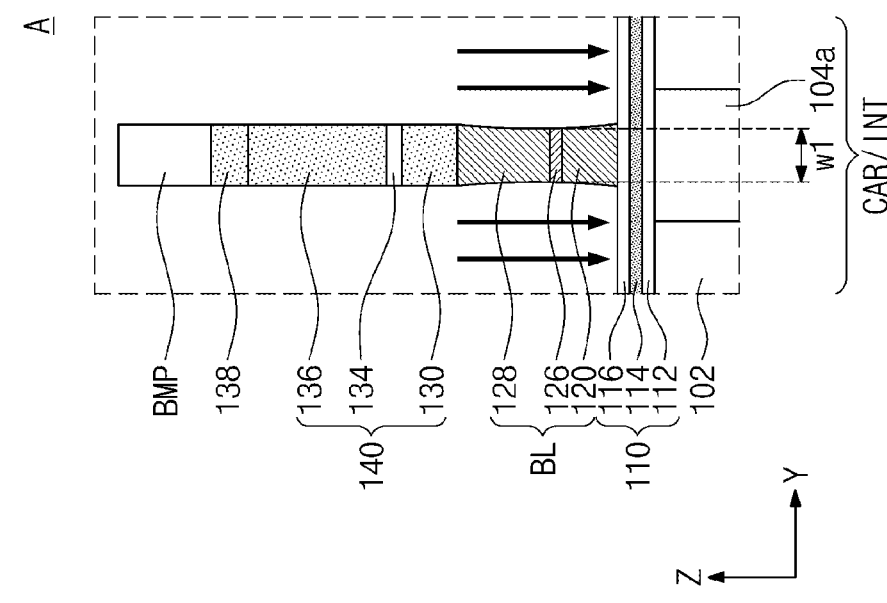

Referring to FIG. 12B, in the second phase of the etching process, the etching process may be performed which uses the bit-line mask pattern BMP and the bit line BL as an etching mask on the cell array region CAR and the boundary region INT.

As depicted in section A, the second phase of the etching process may be performed on the boundary region INT. The electrode layers 120, 126, and 128 may undergo the etching process to form the bit line BL. The second phase of the etching process may be executed to expose the top surface of the buffer layer 110 on the boundary region INT.

As depicted in section B, the second phase of the etching process may be performed on the cell array region CAR. The upper electrode layer 128, the diffusion stop layer 126, and the polysilicon pattern 125 may undergo the etching process to form the bit line BL and the bit-line contact DCC. The second phase of the etching process may be executed to expose the top surface of the buffer layer 110 on the cell array region CAR.

As the top surface of the electrode layer 120, 126, and 128 is simultaneously exposed on the boundary region INT and the cell array region CAR in the first phase, the second phase may simultaneously begin on the boundary region INT and the cell array region CAR. For example, the etching of the electrode layer 120, 126, and 128 may simultaneously begin on the boundary region INT and the cell array region CAR. Therefore, a time (or process time of the second phase) during which the electrode layer 120, 126, and 128 or the polysilicon pattern 125 is exposed to an etchant may be same between the boundary region INT and the cell array region CAR.

According to some embodiments, during the etching process, the bit line BL or the bit-line contact DCC may be over-etched on a lateral surface thereof. For example, after the etching process, the bit line BL or the bit-line contact DCC may be over-etched on a central portion thereof and may be or not be partially etched on a lower portion thereof.

Thus, the bit line BL or the bit-line contact DCC may be formed to have a concave shape at the lateral surface thereof.

As a time during which the electrode layers 120, 126, and 128 or the polysilicon pattern 125 is exposed to an etchant is the same between the boundary region INT and the cell array region CAR, a width w1 of the bit line BL on the boundary region INT may be substantially same as or similar to a width w2 of the bit line BL on the cell array region CAR. In this description, a width of the bit line BL may indicate a width of a portion that becomes thinner due to the over-etching.

When the additional capping pattern 138 is not provided on the capping layer 130, 134, and 136, the bit line BL may be over-etched on the boundary region INT.

Figure 13A:
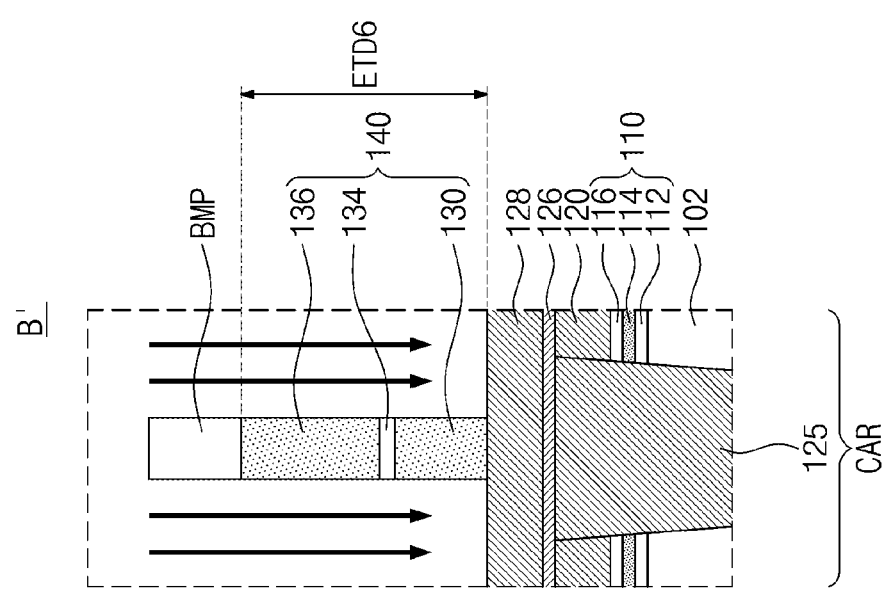
Figure 13A:
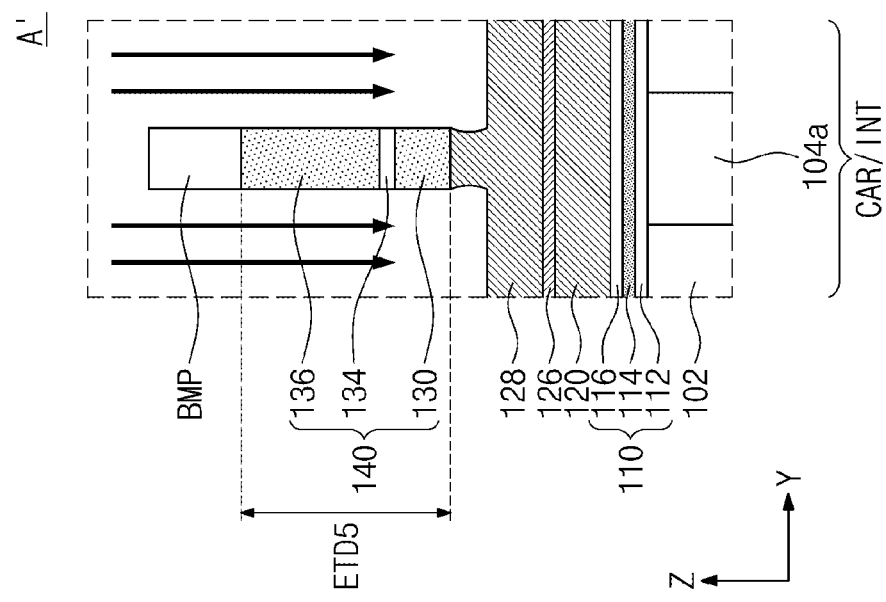

Referring to FIG. 13A, the boundary region INT may not include the additional capping pattern 138 or the cell array region CAR may not include the additional capping pattern 138 on its portion adjacent to the boundary region INT. For convenience, the following description will focus on the boundary region INT. In this case, the bit-line mask pattern BMP may be formed on the third capping layer 136 on the boundary region INT.

As shown in FIG. 13A, in the first phase of the etching process, the etching process may be performed to which uses the bit-line mask pattern BMP as an etching mask on the cell array region CAR and the boundary region INT.

As depicted in section A', the first phase of the etching process may be performed on the boundary region INT. The etching process may be performed on the capping layer 130, 134, and 136 such that the capping layer 130, 134, and 136 may be etched to a fifth etching depth ETD5. The first phase of the etching process may be executed to expose the top surface of the electrode layer 120, 126, and 128 on the boundary region INT.

As depicted in section B', the first phase of the etching process may be performed on the cell array region CAR. The etching process may be performed on the capping layer 130, 134, and 136 such that the capping layer 130, 134, and 136 may be etched to a sixth etching depth ETD6. The first phase of the etching process may be executed to expose the top surface of the electrode layer 120,126, and 128 on the cell array region CAR.

As the capping layer 130, 134, and 136 has a thickness that is different between the boundary region INT and the cell array region CAR, a process time it takes for the capping layer 130, 134, and 136 to be etched to expose the top surface of the electrode layer 120, 126, and 128 may be different between the cell array region CAR and the boundary region INT. For example, the top surface of the electrode layers 120, 126, and 128 may be first exposed on the boundary region INT on which an etching depth is smaller. Afterwards, the etching process may continue until the capping layer 130, 134, and 136 is etched to expose the top surface of the electrode layer 120, 126, and 128, and in this case the upper electrode layer 128 may be partially etched on the boundary region INT. For example, the second phase in which the electrode layer 120, 126, and 128 is etched may begin earlier on the boundary region INT than on the cell array region CAR.

Figure 13B:
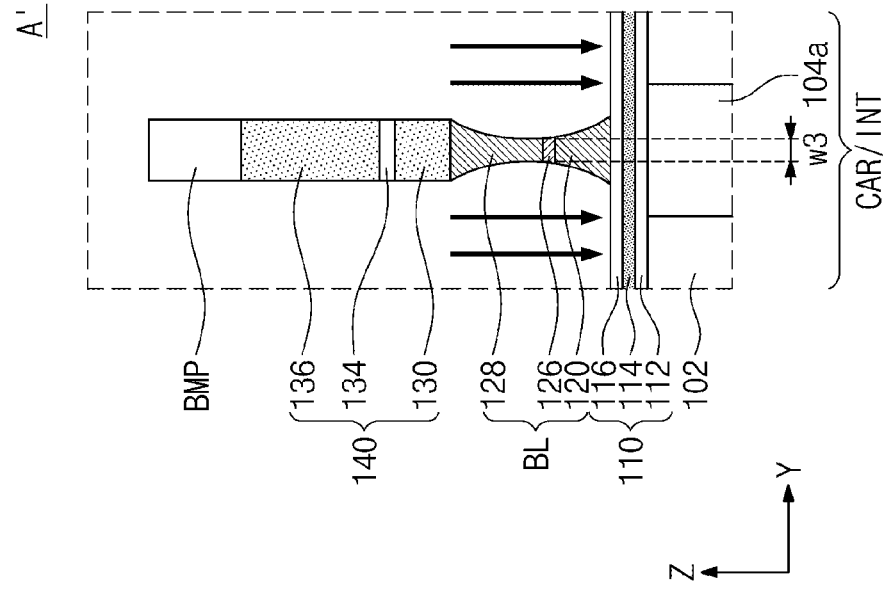
Figure 14A:
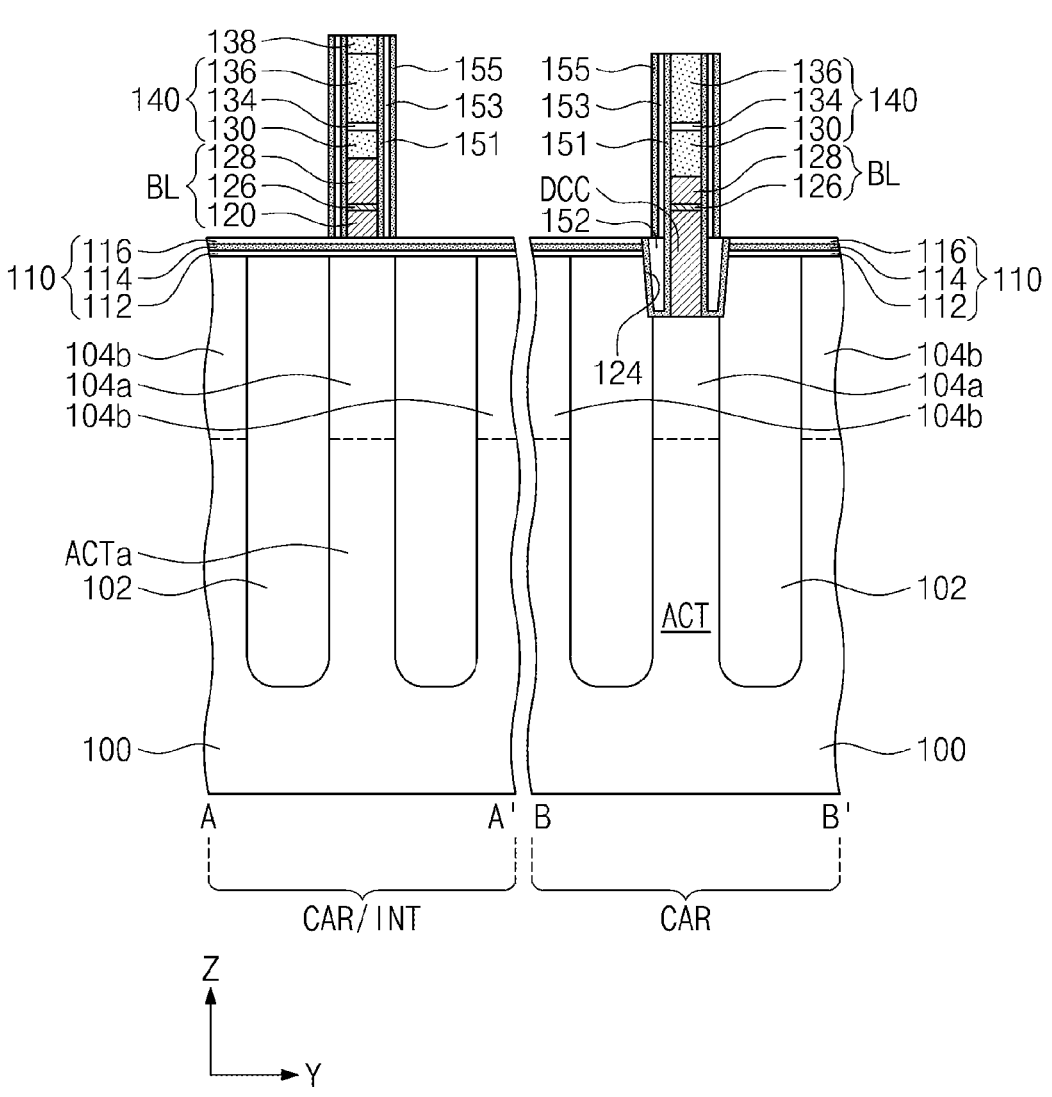
Figure 14B:
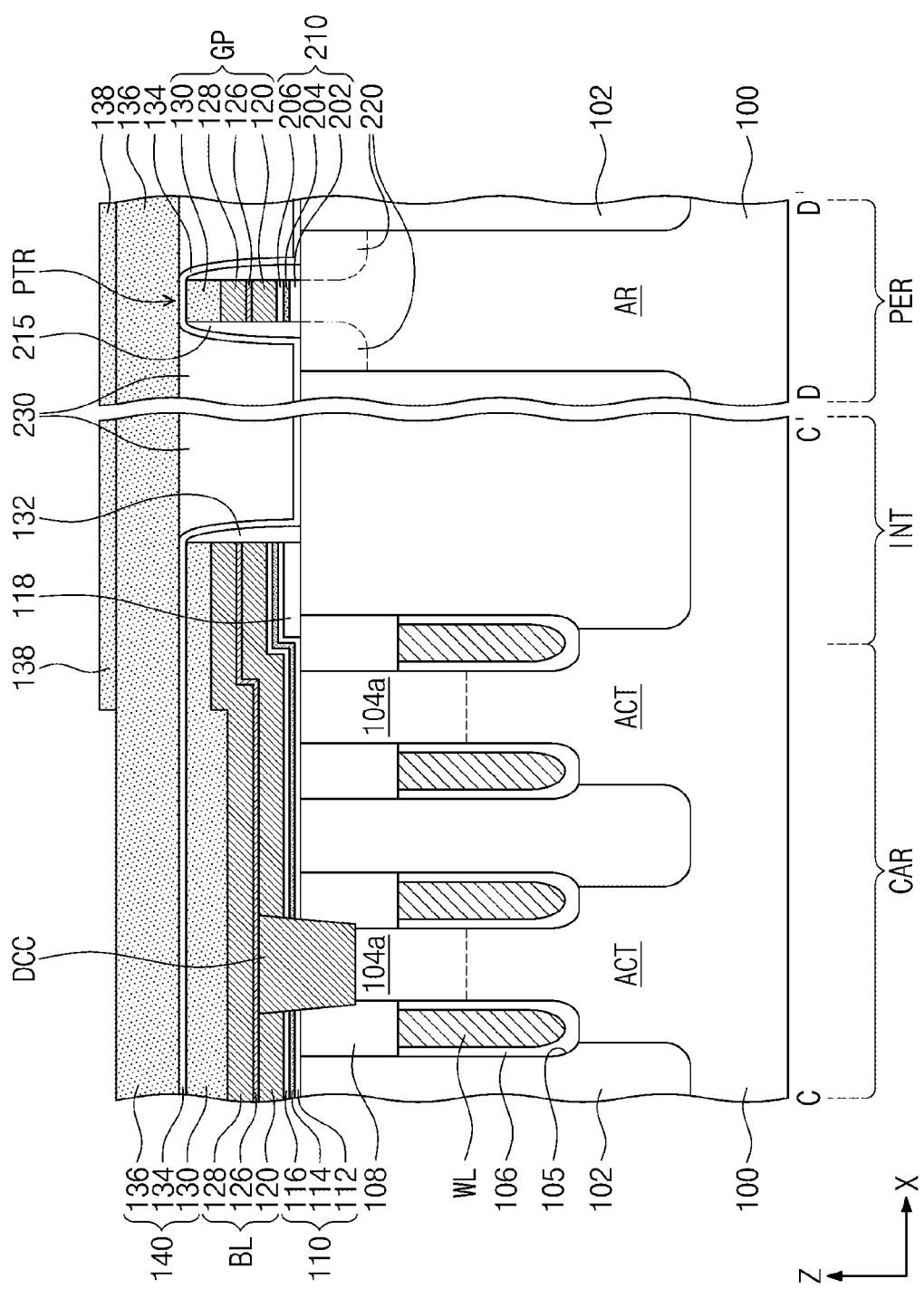

Referring to FIG. 13B, in the second phase of the etching process, the etching process may be performed which uses the bit-line mask pattern BMP and the bit line BL as an etching mask on the cell array region CAR and the boundary region INT.

As depicted in section A', the second phase of the etching process may be performed on the boundary region INT. The electrode layers 120, 126, and 128 may undergo the etching process to form the bit line BL. The second phase of the etching process may be executed to expose the top surface of the buffer layer 110 on the boundary region INT.

As depicted in section B', the second phase of the etching process may be performed on the cell array region CAR. The upper electrode layer 128, the diffusion stop layer 126, and the polysilicon pattern 125 may undergo the etching process to form the bit line BL and the bit-line contact DCC. The second phase of the etching process may be executed to expose the top surface of the buffer layer 110 on the cell array region CAR.

In the first phase, as the top surface of the electrode layer 120, 126, and 128 is exposed earlier on the boundary region INT than on the cell array region CAR, the second phase may begin earlier on the boundary region INT than on the cell array region CAR. Therefore, a time (or process time of the second phase) during which the electrode layer 120, 126, and 128 or the polysilicon pattern 125 is exposed to an etchant may be longer on the boundary region INT than on the cell array region CAR.

During the etching process, the bit line BL or the bit-line contact DCC may be over-etched on a lateral surface thereof as a time during which the electrode layers 120, 126, and 128 or the polysilicon pattern 125 is exposed to an etchant is longer on the boundary region INT than on the cell array region CAR, a width w3 of the bit line BL on the boundary region INT may be less than a width w4 of the bit line BL on the cell array region CAR. In this case, the width w3 of the bit line BL may become excessively thin on the boundary region INT, and the bit line BL may be cut off or collapse.

According to some embodiments of the present inventive concepts, a time during which the electrode layers 120, 126, and 128 or the polysilicon pattern 125 is exposed to an etchant is same between the boundary region INT and the cell array region CAR, the width w1 of the bit line BL on the boundary region INT may be substantially same as or similar to the width w2 of the bit line BL on the cell array region CAR. Accordingly, on the boundary region INT, the bit line BL may be prevented from being excessively etched in the etching process that forms the bit line BL. As a result, it may be possible to provide a method of fabricating a semiconductor memory device, in which method the occurrence of defects is reduced, and to provide a semiconductor memory device whose structural stability is improved.

Referring to FIGS. 1, 2, 14A, and 14B, a first spacer layer may be conformally formed on the substrate 100. The first spacer layer may conformally cover a bottom surface and an inner sidewall of the recess 124. The first spacer layer may be formed of a silicon nitride layer. Afterwards, stacking on the substrate a dielectric layer, such as a silicon nitride layer, to fill the recess 124, and performing on the dielectric layer an anisotropic etching process to leave a buried dielectric pattern 152 in the recess 124. In this case, when the anisotropic etching process is performed, the first spacer layer may also be etched to form a first spacer 151.

A sacrificial spacer layer may be conformally formed on the substrate 100, and then an anisotropic etching process may be performed to form a sacrificial spacer 153 that covers a sidewall of the first spacer 151. The sacrificial spacer 153 may include a material having an etch selectivity with respect to the first spacer 151. For example, the sacrificial spacer 153 may be formed of a silicon oxide layer.

A second spacer 155 may be formed to cover a sidewall of the sacrificial spacer 153. For example, a second spacer layer may be conformally formed on the substrate 100, and then an anisotropic etching process may be performed to form a second spacer 155. The second spacer 155 may be formed of a silicon nitride layer.

Referring to FIGS. 1, 2, and 15, the second impurity section 104*b* may be exposed. For example, after the formation of the second spacer 155, the buffer layer 110 between the bit lines BL may be etched to form a contact hole CH. In this step, the second impurity section 104*b* and the device isolation layer 102 may also be partially etched. The buffer layer 110 may be etched by an etching process separately performed after the formation of the second spacer 155. Alternatively, the buffer layer 110 may be etched in the anisotropic etching process for forming the second spacer 155.

In some embodiments, after the formation of the sacrificial spacer 153, the second impurity section 104*b* may be exposed. For example, after the formation of the sacrificial spacer 153, the buffer layer 110 between the bit lines BL may be etched to form the contact hole CH. In this step, the second impurity section 104*b* and the device isolation layer 102 may also be partially etched. Thereafter, the second spacer 155 may be formed. In this case, the second spacer 155 may cover a lateral surface of the buffer layer 110, which lateral surface is exposed to the contact hole CH. The following description will focus on the embodiment of FIG. 15.

A storage node contact BC may be formed in the contact hole CH. For example, a selective epitaxial growth process may be performed in which the second impurity section 104*b* exposed to the contact hole CH is used as a seed, such that the storage node contact BC may be grown from the second impurity section 104*b*. Afterwards, the grown selective epitaxial layer may be etched to form the storage node contact BC between neighboring second spacers 155, which storage node contact BC has a top surface lower than that of the bit-line capping pattern 140. The storage node contact BC may include single-crystalline silicon.

Although not shown, a subsequent etching process may be performed to remove the sacrificial spacer 153 and the second spacer 155 whose lateral surfaces are not covered with the storage node contact BC and to expose an upper sidewall of the first spacer 151. Therefore, an upper portion of the first spacer 151 may be exposed. This process may increase a process margin for forming a landing pad LP which will be discussed below. When removing the upper portions of the sacrificial spacer 153 and the second spacer 155, the upper portion of the first spacer 151 may also be partially removed to cause the first spacer 151 to have a small width.

Although not shown, an ohmic layer may be formed on the storage node contact BC, and a diffusion stop layer may be conformally formed on the substrate 100.

On the substrate 100, a landing pad layer may be formed to fill a space between the bit-line capping patterns 140. The landing pad layer may include tungsten (W). After mask pattern are formed on the landing pad layer, an anisotropic etching process may be performed in which the mask patterns are used as an etching mask to remove a portion of the landing pad layer. Therefore, the landing pad layer may be divided to form landing pads LP, and openings may be formed to partially expose the bit-line capping patterns 140. When a diffusion stop layer is provided, the openings may expose the diffusion stop layer.

An anisotropic etching process may be performed to partially remove the bit-line capping patterns 140 and the first spacers 151 that are exposed to the openings, thereby exposing the sacrificial spacers 153.

An isotropic etching process may be performed to remove the sacrificial spacer 153. The removal of the sacrificial spacer 153 may form an air gap between the first spacer 151 and the second spacer 155.

Afterwards, a pad separation layer 162 may be formed to fill the openings. The pad separation layer 162 may also be formed on the landing pads LP. The pad separation layer 162 may close an upper portion of the air gap.

A cell contact 164 may be formed on the landing pad LP. If necessary, there may be formed a data storage element connected to the cell contact 164.

FIG. 15 illustrates a cross-sectional view showing a semiconductor memory device according to some embodiments of the present inventive concepts.

Referring to FIGS. 1, 2, and 15, a semiconductor substrate 100 (referred to hereinafter as a substrate) may be provided. The substrate 100 may be a bulk silicon substrate, a silicon-on-insulator (SOI) substrate, a germanium substrate, a germanium-on-insulator (GOI) substrate, a silicon-germanium substrate, a III-V group compound semiconductor substrate, or an epitaxial thin-film substrate obtained by performing selective epitaxial growth (SEG).

The substrate 100 may include a cell array region CAR, a peripheral circuit region PER, and a boundary region INT between the cell array region CAR and the peripheral circuit region PER. The cell array region CAR may be an area on which semiconductor cells are disposed to form an array, the peripheral circuit region PER may be an area where peripheral circuits are disposed, such as word-line decoder or sense amplifier circuit, that apply or sense electrical signals to or from word lines WL and bit lines BL disposed on the cell array region CAR. The peripheral circuits may have at least one peripheral transistor PTR. The boundary region INT may correspond to a peripheral part of the cell array region CAR, and may be provided thereon with ends of the word lines WL or the bit lines BL disposed on the cell array region CAR.

A device isolation layer 102 may be disposed in the substrate 100. The device isolation layer 102 may define cell active sections ACT of the substrate 100 on the cell array region CAR and also define a peripheral active section AR on the peripheral circuit region PER. When viewed in a plan view, the cell active sections ACT may correspond to portions of the substrate 100 that are surrounded by the device isolation layer 102. Each of the cell active sections ACT may have an isolated shape or be isolated from one another. The cell active sections ACT may each have a bar shape elongated in the third direction S. The cell active sections ACT may be parallel to each other in the third direction S. The cell active sections ACT may have their ends that are arranged adjacent to centers of neighboring other cell active sections ACT. The boundary region INT may be provided with one ACTa of the cell active sections ACT, or the cell array region CAR may be provided with the cell active section ACTa on its portion adjacent to the boundary region INT. The one ACTa of the cell active sections ACT may be disposed adjacent to an end of the bit line BL which will be discussed below. For example, the one ACTa of the cell active sections ACT may intersect one of the word lines WL that is most adjacent to the boundary region INT.

First and second impurity sections 104*a* and 104*b* may be formed in the cell active sections ACT. The first impurity section 104*a* may be formed on a central portion of each cell active section ACT, and a pair of second impurity sections 104*b* may be formed on opposite edge portions of each cell active section ACT. The first and second impurity sections 104a and 104b may each have a different conductivity type from that of the substrate 100. The first impurity section 104a may correspond to a common drain section, and the second impurity sections 104b may correspond to source sections.

The word line WL may be provided in the substrate 100. For example, the word lines WL may be provided in word-line trenches 105 that run across the cell active sections ACT. The word lines WL may be arranged in the first direction X and may extend in the second direction Y. The word lines WL may be formed to correspondingly run across the cell active sections ACT. The word-line trenches 105 may have their bottom surfaces located at a higher vertical level than that of a bottom surface of the device isolation layer 102. Although not shown, the word-line trenches 105 may be formed to have their bottom surfaces that are relatively deeper in the device isolation layer 102 and relatively shallower in the cell active sections ACT. The word lines WL may include a conductive material. For example, the word lines WL may include polysilicon, doped polysilicon, metal, or metal silicide.

A word-line dielectric layer 106 may be interposed between the word line WL and the word-line trench 105. The word-line dielectric layer 106 may include a dielectric material. The word-line dielectric layer 106 may include, for example, a silicon oxide layer, a thermal oxide layer, or a high-k dielectric layer.

Word-line capping patterns 108 may be formed in upper spaces of the word-line trenches 105. The word-line capping patterns 108 may be disposed on the word lines WL and may completely fill the word-line trenches 105. The word-line capping patterns 108 may have their linear shapes that extend along longitudinal directions of the word lines WL, and cover entire top surfaces of the word lines WL. The word-line capping patterns 108 may have their top surfaces located at the same level as that of a top surface of the substrate 100. The word-line capping patterns 108 may include a dielectric material. For example, the word-line capping patterns 108 may include a silicon oxide layer, a silicon nitride layer, or a silicon oxynitride layer.

A cell transistor may be constituted by each of the word lines WL and its adjacent first and second impurity sections 104a and 104b. As the word lines WL are disposed within the word-line trenches 105, the word lines WL may be provided thereunder with channel sections each of which channel lengths increases within a limited planar area.

A peripheral gate dielectric structure 210 may be provided on the substrate 100 on the peripheral circuit region PER. For example, the peripheral gate dielectric structure 210 may be disposed on the peripheral active section AR on the peripheral circuit region PER.

The peripheral gate dielectric structure 210 may include a peripheral gate dielectric layer 202, a peripheral high-k dielectric layer 204, and a metal-containing layer 206. The peripheral gate dielectric layer 202 may include a silicon oxide layer, a silicon nitride layer, or a silicon oxynitride layer. The peripheral high-k dielectric layer 204 may be formed of a material (e.g., metal oxide layer) whose dielectric constant is greater than that of the peripheral gate dielectric layer 202. For example, the peripheral high-k dielectric layer 204 may be formed of at least one material selected from hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). The metal-containing layer 206 may be provided to adjust a threshold voltage of a peripheral transistor PTR formed on the peripheral circuit region PER. The metal-containing layer 206 may be formed of a metal-containing layer having an N-type work function or P-type work function. For example, the metal-containing layer 206 having an N-type work function may include at least one selected from lanthanum (La), lanthanum oxide (LaO), tantalum (Ta), tantalum nitride (TaN), niobium (Nb), and titanium nitride (TiN). For example, the metal-containing layer 206 having a P-type work function may include at least one selected from aluminum (Al), aluminum oxide ($Al_2O_3$), titanium nitride (TiN), tungsten nitride (WN), and ruthenium oxide ($RuO_2$).

Although not shown, a channel layer may be interposed between the substrate 100 and the peripheral gate dielectric structure 210. The channel layer may have a lattice constant greater than that of the substrate 100. For example, the channel layer may be formed of silicon-germanium (SiGe).

Peripheral source/drain sections 220 may be provided in the peripheral active section AR adjacent to the peripheral gate dielectric structure 210. The peripheral source/drain sections 220 may have a different conductivity type from that of the peripheral active section AR.

A peripheral gate pattern GP may be provided on the peripheral gate dielectric structure 210. The peripheral gate pattern GP may include a lower electrode layer 120, a diffusion stop layer 126, an upper electrode layer 128, and a first capping layer 130 that are sequentially stacked on the peripheral gate dielectric structure 210. The lower electrode layer 120 may include impurity-doped polysilicon. The diffusion stop layer 126 may be at least one selected from a titanium nitride layer, a tungsten nitride layer, and a tantalum nitride layer. The upper electrode layer 128 may include one of tungsten, aluminum, and copper. The first capping layer 130 may be formed of a silicon nitride layer.

A peripheral transistor PTR may be constituted by the peripheral gate pattern GP and the peripheral source/drain sections 220.

The peripheral gate pattern GP may be provided with peripheral spacers 215 on sides thereof. The peripheral spacers 215 may expose at least portions of the peripheral source/drain sections 220 while covering sidewalls of the peripheral gate pattern GP.

An intermediate layer 118 may be provided on the substrate 100. The intermediate layer 118 may be disposed on the boundary region INT. The intermediate layer 118 may be a layer of byproduct generated in a process that forms either memory cells on the cell array region CAR or peripheral circuits on the peripheral circuit region PER in fabricating a semiconductor memory device. For example, the intermediate layer 118 may be a portion of one the channel layer and the peripheral gate dielectric structure 210 each of which remains on the boundary region INT. The present inventive concepts, however, are not limited thereto.

A buffer layer 110 may be provided on the substrate 100. The buffer layer 110 may cover ends of neighboring two cell active sections ACT on the cell array region CAR. The buffer layer 110 may cover top surfaces of the word-line capping patterns 108. The buffer layer 110 may extend onto the boundary region INT to cover at least a portion of the intermediate layer 118. Therefore, the buffer layer 110 may have a step difference on an end of the intermediate layer 118. For example, the boundary region INT may be provided with the end of the buffer layer 110, or the cell array region CAR may be provided with the end of the buffer layer 110 on its portion adjacent to the boundary region INT. The position of the end of the buffer layer 110 may depend on that of the intermediate layer 118, but the following description will focus on the boundary region INT in the interest of convenience. The buffer layer 110 may have a top surface located at a vertical level that is higher on the boundary region INT than on the cell array region CAR. The buffer layer 110 may include a first dielectric layer 112, a second dielectric layer 114, and a third dielectric layer 116 that are sequentially stacked on the substrate 100. The second dielectric layer 114 may be formed of a silicon nitride layer. The first and third dielectric layers 112 and 116 may be formed of a silicon oxide layer.

A bit-line contact DCC may be disposed on a central portion of each cell active section ACT disposed between two word lines WL. The bit-line contact DCC may penetrate the buffer layer 110 and electrically connect with one first impurity section 104a disposed in each cell active section ACT between the two word lines WL. The bit-line contact DCC may have a sidewall in contact with a lateral surface of the buffer layer 110. The bit-line contact DCC may have a bottom surface located at a level between that of the top surface of the substrate 100 and that of the top surfaces of the word lines WL. For example, a recess 124 is formed to penetrate the first dielectric layer 112 and to lie in a portion of each of the substrate 100 and the device isolation layer 102, and the bit-line contact DCC may be disposed in the recess 124 that exposes the first impurity section 104a disposed between a pair of word lines WL. The bit-line contact DCC may be formed locally in a partial area of the recess 124. For example, the bit-line contact DCC may be in contact in the first direction X with an inner wall of the contact hole CH and may be spaced apart in the second direction Y from an inner wall of the recess 124. The bit-line contact DCC may include, for example, impurity-doped polysilicon.

On the cell array region CAR, the bit lines BL may be provided on the buffer layer 110. The bit lines BL may extend along the first direction X and may be spaced apart from each other in the second direction Y. In this case, the bit lines BL may extend from the cell array region CAR toward the boundary region INT, and ends of the bit lines BL may be positioned on the boundary region INT. Each of the bit lines BL may run over a plurality of bit-line contacts DCC arranged in the first direction X. A single bit line BL may electrically connect with a plurality of bit-line contacts DCC arranged in the first direction X. The bit line BL may be electrically coupled through the bit-line contact DCC to the first impurity section 104a. As the buffer layer 110 has the step difference, the bit lines BL covering the buffer layer 110 may have a first step difference STP1 on an end of the intermediate layer 118 or on a location adjacent to the end of the intermediate layer 118. For example, the bit lines BL may have their top surfaces located at a vertical level that is higher on the boundary region INT than on the cell array region CAR.

Each of the bit lines BL may include a lower electrode layer 120, a diffusion stop layer 126, and an upper electrode layer 128 that are sequentially stacked on the bit-line contact DCC. The bit-line contact DCC may penetrate the lower electrode layer 120 and may be coupled to the diffusion stop layer 126. The lower electrode layer 120 may include an impurity-doped polysilicon layer. The diffusion stop layer 126 may be at least one selected from a titanium nitride layer, a tungsten nitride layer, and a tantalum nitride layer. The upper electrode layer 128 may include one of tungsten, aluminum, and copper.

The bit lines BL may be provided thereon with corresponding bit-line capping patterns 140. The bit-line capping patterns 140 may have their top surfaces that are substantially flat and parallel to the substrate 100 (e.g., parallel or substantially parallel to a top surface or a bottom surface of the substrate 100). As the bit lines BL have the first step difference STP1, the bit-line capping patterns 140 may each have a thickness that is different between the cell array region CAR and the boundary region INT. For example, the thickness of each of the bit-line capping patterns 140 on the cell array region CAR may be greater than the thickness of each of the bit-line capping patterns 140 on the boundary region INT. In this case, a distance between top surfaces of the bit lines BL and top surfaces of the bit-line capping patterns 140 on the cell array region CAR may be greater than a distance between the top surfaces of the bit lines BL and the top surfaces of the bit-line capping patterns 140 on the boundary region INT. The bit-line capping pattern 140 may include a first capping layer 130, a second capping layer 134, and a third capping layer 136 that are sequentially stacked on the bit line BL. On the first capping layer 130, the second capping layer 134 may extend toward the boundary region INT. On the boundary region INT, the second capping layer 134 may conformally cover the bit lines BL and the first capping layer 130. For example, on the boundary region INT, the second capping layer 134 may cover ends of the bit lines BL and an end of the first capping layer 130. A portion of the second capping layer 134 may extend onto the peripheral circuit region PER to conformally cover the peripheral transistor PTR. On the boundary region INT and the peripheral circuit region PER, a peripheral interlayer dielectric layer 230 may fill a space between the peripheral transistor PTR and the bit lines BL. The peripheral interlayer dielectric layer 230 may have a top surface coplanar with that of the second capping layer 134. A portion of the third capping layer 136 may extend onto the boundary region INT and the peripheral circuit region PER to cover the peripheral interlayer dielectric layer 230 and the peripheral transistor PTR. The first and third capping layers 130 and 136 may include a silicon nitride layer. The second capping layer 134 may include a silicon oxide layer.

An additional capping pattern 138 may be provided on the bit-line capping pattern 140. The additional capping pattern 138 may cover the bit-line capping pattern 140 on the boundary region INT. The additional capping pattern 138 may have an end that is vertically aligned with the first step difference STP1 of the bit lines BL. The additional capping pattern 138 may have a thickness the same as a height of the first step difference STP1 of the bit lines BL. Therefore, the thickness of the bit-line capping pattern 140 on the cell array region CAR may be greater than a sum of the additional capping pattern 138 and the thickness of the bit-line capping pattern 140 on the boundary region INT. For example, a sum of the thicknesses of the bit-line capping pattern 140 and the additional capping pattern 138 may be constant on the boundary region INT and the cell array region CAR (the thickness of the additional capping pattern 138 corresponds to zero on the cell array region CAR). The additional capping pattern 138 may include a silicon nitride layer or a silicon oxide layer. FIG. 15 depicts that the additional capping pattern 138 is also provided on the peripheral circuit region PER, but the present inventive concepts are not limited thereto. The additional capping pattern 138 may be provided only on the boundary region INT and may not cover the peripheral circuit region PER.

A buried dielectric pattern 152 may be disposed in the recess 124 or a portion thereof in which the bit-line contact DCC is not disposed. The buried dielectric pattern 152 may have at least one single-layered or multi-layered structure including a silicon oxide layer, a silicon nitride layer, and/or a silicon oxynitride layer.

Storage node contacts BC may be disposed between a pair of neighboring bit lines BL. The storage node contacts BC may be spaced apart from each other. The storage node contacts BC may be correspondingly disposed in ends of the cell active sections ACT. For example, the storage node contacts BC may be connected to the second impurity sections 104*b* of the cell active sections ACT. The storage node contacts BC may have their lower portions that penetrate the buffer layer 110 and are correspondingly disposed in the cell active sections ACT. The storage node contacts BC may have their top surfaces located at a vertical level higher than that of the top surface of the buffer layer 110. The storage node contact BC may include single-crystalline silicon.

The bit line BL and the storage node contact BC may be provided therebetween with a bit-line spacer that includes a first spacer 151 and a second spacer 155 that are spaced apart from each other across an air gap. The first spacer 151 may cover a sidewall of the bit line BL and a sidewall of the bit-line capping pattern 140. The second spacer 155 may be adjacent to the storage node contact BC. The first spacer 151 and the second spacer 155 may include the same material. For example, the first spacer 151 and the second spacer 155 may include silicon nitride. The first spacer 151 may extend to cover a sidewall of the bit-line contact DCC and may also cover a sidewall and a bottom surface of the recess 124.

Although not shown, a storage node ohmic layer may be disposed on the storage node contact BC. The storage node ohmic layer may include metal silicide. A diffusion stop pattern may cover the storage node ohmic layer, the first and second spacers 151 and 155, and the bit-line capping pattern 140. The diffusion stop pattern may include metal nitride, such as titanium nitride (TiN) or tantalum nitride (TaN).

Landing pads LP may be disposed on the diffusion stop pattern. Each of the landing pads LP may have an upper portion that covers the top surface of the bit-line capping pattern 140. Each of the landing pads LP may have a portion that extends between the bit lines BL and is coupled to the storage node contact BC. On the storage node contact BC, the landing pad LP may have a width greater than that of the storage node contact BC. As shown in FIG. 15, a center of the landing pad LP may be shifted in the second direction Y from a center of the storage node contact BC. A portion of the bit line BL may vertically overlap or be vertically aligned with the landing pad LP. The landing pad LP may include a material containing metal such as tungsten (W).

A pad separation layer 162 may be interposed between the landing pads LP. The pad separation layer 162 may include a silicon nitride layer, a silicon oxide layer, a silicon oxynitride layer, or a porous layer. The pad separation layer 162 may define a top end of the air gap provided between the first spacer 151 and the second spacer 155.

A cell contact 164 may be disposed on each of the landing pads LP. The cell contact 164 may include at least one selected from an impurity-doped polysilicon layer, a metal nitride layer, and a metal layer. The metal nitride layer may include, for example, a titanium nitride layer. For example, the metal layer may include tungsten (W), aluminum (Al), or copper (Cu). The cell contact 164 may serve as a pad for connection with a data storage element. Alternatively, the cell contact 164 may be one of electrodes included in a data storage element.

In a method of fabricating a semiconductor memory device according to some embodiments of the present inventive concepts, because a time during which an electrode layer or a polysilicon pattern is exposed to an etchant is same between a boundary region and a cell array region, a bit line may be prevented from being excessively etched on the boundary region during an etching process for forming the bit line. As a result, it may be possible to provide a method of fabricating a semiconductor memory device, in which method the occurrence of defects is reduced, and to provide a semiconductor memory device whose structural stability is improved.

Although the present inventive concepts have been described in connection with some embodiments of the present inventive concepts illustrated in the accompanying drawings, it will be understood by one of ordinary skill in the art that variations in form and detail may be made therein without departing from the essential features of the present inventive concepts. The above disclosed embodiments should thus be considered illustrative and not restrictive.

What is claimed is:

1. A method of fabricating a semiconductor memory device, the method comprising:

providing a substrate that includes a cell array region and a boundary region;

forming a device isolation layer that defines a plurality of active sections on an upper portion of the substrate on the cell array region;

forming an intermediate layer on the substrate on the boundary region;

forming on the substrate on the cell array region and the boundary region an electrode layer that covers the intermediate layer on the boundary region;

forming a capping layer on the electrode layer;

forming an additional capping pattern including providing a first step difference to the capping layer on the boundary region; and allowing the additional capping pattern, the capping layer, and the electrode layer to proceed an etching process to form a plurality of bit lines that run across the active sections, wherein a thickness of the capping layer on the cell array region is greater than a thickness of the capping layer on the boundary region, wherein, during the etching process, a top surface of the electrode layer is simultaneously exposed on the cell array region and the boundary region, and wherein, during the etching process, the thickness of the capping layer on the cell array region is the same as a height from a bottom surface of the capping layer on the boundary region to a top surface of the additional capping pattern on the boundary region.

2. The method of claim 1, wherein on the boundary region, a top surface of the electrode layer has a second step difference on the intermediate layer, and a height of the first step difference is substantially same as a height of the second step difference.

3. The method of claim 1, wherein a top surface of the capping layer has a flat surface that is substantially parallel to a top surface of the substrate.

4. The method of claim 1, wherein, during the etching process, a first process time it takes for the capping layer to be etched to expose the top surface of the electrode layer on the cell array region is the same as a second process time it takes for the additional capping pattern and the capping layer to be etched to expose the top surface of the electrode layer on the boundary region.

5. The method of claim 1, wherein the capping layer includes a silicon nitride layer, and the additional capping pattern includes a silicon oxide layer.

6. The method of claim 1, before forming the electrode layer, further comprising forming a buffer layer that covers the active sections on the substrate, wherein the buffer layer extends along a top or bottom surface of the intermediate layer on the boundary region.

7. The method of claim 1, wherein the plurality of bit lines are formed to run across the substrate on the cell array region and to extend toward the boundary region, wherein an end of each bit line is on the intermediate layer.

\* \* \* \* \*